US00RE43947E

(19) United States
(12) Reissued Patent
Haerle et al.

(10) Patent Number: US RE43,947 E
(45) Date of Reissued Patent: Jan. 29, 2013

(54) DELAY LOCKED LOOP CIRCUIT AND METHOD

(75) Inventors: Dieter Haerle, Villach (AU); Tony Mai, Kanata (CA); Peter Vlasenko, Kamata (CA)

(73) Assignee: Mosaid Technologies Incorporated, Ottawa, Ontario (CA)

(21) Appl. No.: 13/105,749

(22) Filed: May 11, 2011

Related U.S. Patent Documents

Reissue of:
(64) Patent No.: 7,532,050
Issued: May 12, 2009
Appl. No.: 11/906,872
Filed: Oct. 4, 2007

U.S. Applications:
(63) Continuation of application No. 11/699,268, filed on Jan. 29, 2007, now Pat. No. 7,285,997, which is a continuation of application No. 11/050,644, filed on Feb. 3, 2005, now Pat. No. 7,190,201.

(51) Int. Cl.
*H03L 7/06* (2006.01)
(52) U.S. Cl. ..... 327/158; 327/159; 327/161
(58) Field of Classification Search ..... None
See application file for complete search history.

(56) References Cited

U.S. PATENT DOCUMENTS

| | | | |
|---|---|---|---|
| 4,338,569 | A | 7/1982 | Petrich |
| 4,590,602 | A | 5/1986 | Wolaver |
| 4,604,582 | A | 8/1986 | Strenkowski et al. |
| 4,623,805 | A | 11/1986 | Flora et al. |
| 4,754,164 | A | 6/1988 | Flora |
| 4,755,704 | A | 7/1988 | Flora et al. |
| 5,109,394 | A | 4/1992 | Hjerpe et al. |
| 5,223,755 | A | 6/1993 | Richley |
| 5,233,314 | A | 8/1993 | McDermott et al. |
| 5,272,729 | A | 12/1993 | Bechade et al. |
| 5,317,202 | A | 5/1994 | Waizman |
| 5,362,990 | A | 11/1994 | Alvarez et al. |
| 5,440,514 | A | 8/1995 | Flannagan et al. |
| 5,440,515 | A | 8/1995 | Chang et al. |
| 5,473,283 | A | 12/1995 | Luich |
| 5,544,203 | A | 8/1996 | Casasanta et al. |
| 5,604,775 | A | 2/1997 | Saitoh et al. |
| 5,614,855 | A | 3/1997 | Lee et al. |
| 5,796,673 | A | 8/1998 | Foss et al. |
| 5,933,037 | A | 8/1999 | Momtaz |
| 5,994,934 | A | 11/1999 | Yoshimura et al. |

(Continued)

FOREIGN PATENT DOCUMENTS

| | | | |
|---|---|---|---|
| EP | 0 484 059 | A2 | 5/1992 |
| EP | 0 755 120 | A1 | 1/1997 |

(Continued)

OTHER PUBLICATIONS

Sidiropoulos, S., et al., "A Semidigital Dual Delay-Locked Loop," JSSC, vol. 32(11), Nov. 1997, pp. 1683-1692.

(Continued)

*Primary Examiner* — An Luu
(74) *Attorney, Agent, or Firm* — Hamilton, Brook, Smith & Reynolds, P.C.

(57) ABSTRACT

A delay locked loop includes initialization circuitry that ensures that a DLL is initialized to an operating point that is not to close to either end of a delay vs. control voltage characteristic. The initialization circuitry forces the DLL to initially search for a lock point starting from an initial delay, the delay is varied in one direction, forcing the DLL to skip the first lock point. The initialization circuitry only allows the DLL to vary the delay of the voltage controlled delay loop in the one direction from the initial delay until the operating point is reached.

52 Claims, 12 Drawing Sheets

U.S. PATENT DOCUMENTS

| | | | |
|---|---|---|---|
| 6,067,272 | A | 5/2000 | Foss et al. |
| 6,088,255 | A | 7/2000 | Matsuzaki et al. |
| 6,100,736 | A | 8/2000 | Wu et al. |
| 6,124,755 | A | 9/2000 | Parker et al. |
| 6,160,432 | A | 12/2000 | Rhee et al. |
| 6,166,990 | A | 12/2000 | Ooishi et al. |
| 6,205,083 | B1 | 3/2001 | Foss et al. |
| 6,229,362 | B1 | 5/2001 | Choi |
| 6,239,634 | B1 | 5/2001 | McDonagh |
| 6,278,332 | B1 | 8/2001 | Nelson et al. |
| 6,314,052 | B2 | 11/2001 | Foss et al. |
| 6,314,150 | B1 | 11/2001 | Vowe |
| 6,316,987 | B1 | 11/2001 | Dally et al. |
| 6,330,296 | B1 | 12/2001 | Atallah et al. |
| 6,337,590 | B1 | 1/2002 | Millar |
| 6,346,839 | B1 | 2/2002 | Mnich |
| 6,407,597 | B1 | 6/2002 | Ishiwaki |
| 6,437,618 | B2 | 8/2002 | Lee |
| 6,448,820 | B1 | 9/2002 | Wang et al. |
| 6,504,408 | B1 | 1/2003 | von Kaenel |
| 6,512,404 | B2 | 1/2003 | Ruegg et al. |
| 6,518,807 | B1 | 2/2003 | Cho |
| 6,535,051 | B2 | 3/2003 | Kim |
| 6,542,040 | B1 | 4/2003 | Lesea |
| 6,549,041 | B2 | 4/2003 | Waldrop |
| 6,556,643 | B2 | 4/2003 | Merritt |
| 6,603,340 | B2 | 8/2003 | Tachimori |
| 6,617,936 | B2 | 9/2003 | Dally et al. |
| 6,633,201 | B1 | 10/2003 | Milton |
| 6,636,098 | B1 | 10/2003 | Kizer |
| 6,642,762 | B2 | 11/2003 | von Kaenel |
| 6,664,829 | B1 | 12/2003 | Hughes |
| 6,667,641 | B1 | 12/2003 | Wang et al. |
| 6,670,834 | B1 | 12/2003 | Swanson |
| 6,710,665 | B2 | 3/2004 | Maneatis |
| 6,731,667 | B1 | 5/2004 | Lee et al. |
| 6,741,110 | B2 | 5/2004 | Roisen |
| 6,744,292 | B2 | 6/2004 | Chen et al. |
| 6,771,114 | B2 | 8/2004 | Watarai |
| 6,828,835 | B2 | 12/2004 | Cho |
| 6,861,916 | B2 | 3/2005 | Dally et al. |
| 6,867,627 | B1 | 3/2005 | Murtagh |
| 6,924,992 | B2 | 8/2005 | Gaudin et al. |
| 6,954,511 | B2 | 10/2005 | Tachimori |
| 6,989,700 | B2 | 1/2006 | Kim |
| 7,092,689 | B1 | 8/2006 | Boecker et al. |
| 7,098,714 | B2 | 8/2006 | Lin |
| 7,215,596 | B2 | 5/2007 | Jeong |
| 2002/0005763 | A1 | 1/2002 | Aoki |
| 2002/0041196 | A1 | 4/2002 | Demone et al. |
| 2002/0089361 | A1 | 7/2002 | Stubbs et al. |
| 2003/0076142 | A1 | 4/2003 | Ko |
| 2003/0090296 | A1 | 5/2003 | Yoo |
| 2004/0057546 | A1 | 3/2004 | Badets et al. |
| 2004/0125905 | A1 | 7/2004 | Vlasenko et al. |
| 2004/0264621 | A1 | 12/2004 | Mai |
| 2005/0035798 | A1 | 2/2005 | Best |
| 2005/0093579 | A1 | 5/2005 | Yamaguchi |
| 2005/0162200 | A1 | 7/2005 | Haerle |
| 2007/0007941 | A1 | 1/2007 | Lin et al. |

FOREIGN PATENT DOCUMENTS

| | | | |
|---|---|---|---|
| EP | 1 292 033 | A1 | 3/2003 |
| JP | 11-205102 | | 7/1999 |
| WO | WO 2004/114524 | A1 | 12/2004 |

OTHER PUBLICATIONS

Jung, Y.J., et al., "A Dual-Loop Delay-Locked Loop Using Multiple Voltage-Controlled Delay Lines," JSSC, vol. 36(5), May 2001, pp. 784-791.

Moon, Y., et al., "An All-Analog Multiphase Delay-Locked Loop Using a Replica Delay Line for Wide Range Operation and Low-Jitter Performance," JSSC, vol. 35(3) Mar. 2000, pp. 377-384.

Larsson, P., "A 2-1600MHz 1.2-2.5V CMOS Clock Recovery PLL with Feedback Phase-Selection and Averaging Phase-Interpolation for Jitter Reduction," IEEE ISSCC, WA 20.6, 1999, fig. 20.6.3.

Hatakeyama, A., et al., "A 256Mb SDRAM Using a Register-Controlled Digital DLL," Fujitsu Limited, Kawasaki, Japan. Nov. 1997.

Hatakeyama, A., et al, "A 256Mb SDRAM Using a Register-Controlled Digital DLL," *IEEE Journal of Solid-State Circuits,* vol. 32(11), Nov. 1997, pp. 1728-1734.

Efendovich, A., et al., "Multifrequency Zero-Jitter Delay-Locked Loop," *IEEE Journal of Solid-State Circuits,* vol. 29(1), Jan. 1994, pp. 67-70.

Lee, T., et al., "A 2.5V Delay-Locked Loop for an 18Mb 500MB/s DRAM," *IEEE International Solid-State Circuits Conference,* Session 18, Feb. 1994, pp. 300-301.

Duque-Carrillo, J.F., et al, "1-V Rail-to-Rail Operational Amplifiers in Standard CMOS Technology," IEEE Journal of Solid-State Circuits, vol. 35(1): (Jan. 2000).

Maneatis, J.G., "Low-Jitter Process-Independent DLL and PLL Based on Self-Biased Techniques," IEEE Journal of Solid-State Circuits, vol. 31(11) (Nov. 1996).

Kim, C.H., et al., "A 64-Mbit, 640-Mbyte/s Bidirectional Data Strobed, Double-Data-Rate SDRAM with a 40-mW DLL for a 256-Mbyte Memory System," IEEE Journal of Solid-State Circuits, vol. 33(11): (Nov. 1998).

Moon, Y., et al., "An All-Analog Multiphase Delay-Locked Loop Using a Replica Delay Line for Wide-Range Operation and Low-Jitter Performance," IEEE Journal of Solid-State Circuits, vol. 35(3): (Mar. 2000).

Larsson, P., "A 2-1600MHz 1.2-2.5V CMOS Clock-Recovery PLL with Feedback Phase-Selection and Averaging Phase-Interpolation for Jitter Reduction," IEEE Journal of Solid-State Circuits Conference, (1999).

Lee, J-S., et al., "Charge Pump with Perfect Current Matching Characteristics in Phase-locked Loops," Electronic Letters, IEE Stevenage, GB, 36(23):1907-1908 (Nov. 2002).

Hsiang-Hui Chang et al., "A Wide Range Delay-Locked Loop With a Fixed Latency of One Clock Cycle", *IEEE J. Solid State Circuits,* 37(8), Aug. 2002.

Hongil Yoon et al., "A 2.5V, 333-Mb/s/pin, 1-Gbit, Double-Data-Rate Synchronous DRAM", *IEEE J. Solid State Circuits,* 34(11), Nov. 1999.

Se Jun Kim, et al., "A low-Jitter Wide-Range Skew-Calibrated Dual-Loop DLL Using Antifuse Circuitry for High-Speed DRAM", *IEEE J. Solid State Circuits,* 37(6), Jun. 2002.

Supplementary European Search Report issued in European Patent Application No. EP 06704527, dated Sep. 13, 2012 (6 pages).

U.S. Appl. No. 6,642,753, filed 11/2003, Choi (withdrawn).

DELAY LOCKED LOOP CIRCUIT AND METHOD

Matter enclosed in heavy brackets [ ] appears in the original patent but forms no part of this reissue specification; matter printed in italics indicates the additions made by reissue.

RELATED APPLICATIONS

This application is a continuation of U.S. application Ser. No. 11/699,268, filed on Jan. 29, 2007, now U.S. Pat. No. 7,285,997, which was a continuation of U.S. application Ser. No. 11/050,644 filed on Feb. 3, 2005, now U.S. Pat. No. 7,190,201. The entire teachings of the above applications are incorporated herein by reference.

BACKGROUND OF THE INVENTION

FIG. 1 is a block diagram of a prior art conventional Delay Locked Loop (DLL) 100. The main function of a DLL is to synchronize two clock signals by aligning their rising edges. An externally supplied clock signal CK is buffered by clock buffer 101 to provide a reference clock signal CKref that is coupled to a voltage controlled delay line (VCDL) 102 and a phase detector (PD) 104. The voltage controlled delay line 102 produces a DLL output clock signal CKout, which is a delayed version of CKref and is routed to various circuits within a device through a buffering structure referred to as a clock tree.

A feedback clock signal CKf is tapped at a terminal node of a branch of the clock tree or obtained by applying the output clock signal CKout to a replica of the clock tree branch, that is, a replica delay circuit 103 and fed back to the PD 104. The replica delay circuit 103 also known as a delay model or a clock tree branch replica, reproduces all delays added to the output clock signal CKout by the multi-stage buffering structure of the clock tree. The delays include all propagation delays through the logical gates and buffers and delays caused by parasitic impedance of long wires. The final synchronised version of the feedback clock signal CKf is output at the end of every branch of the clock tree. The delay produced by the VCDL 102 is variable and controllable through a variable control voltage Vc applied to the VCDL 102. The ability to vary the delay produced by the VCDL 102 is used by the DLL 100 to synchronize the reference clock signal CKref and the feedback clock signal CKf by aligning the rising edges of the clock signals (CKref, CKf).

The phase detector 104 typically generates variable width pulses on the UP and DOWN output signals dependent on the phase difference between the reference clock signal CKref and the feedback clock signal CKf. The variable width pulses on the UP and DOWN output signals are integrated by a charge pump 105 and a loop filter 106 coupled to the output of the charge pump 105 in order to provide the variable control voltage Vc for the VCDL 102. The control voltage Vc determines the delay to be added to the reference clock signal CKref by the VCDL 102 to align the rising edges of the feedback clock signal CKf and reference clock signal CKref. Together, charge pump 105 and loop filter 106 constitute a control voltage generator 107.

FIG. 2 is a graph illustrating a typical control voltage Vc vs. controlled delay characteristic. The characteristic is non-linear and includes a flat region 202, an optimum region 200 and a steep region 204. In the flat region 202, a wide variation in the control voltage Vc is required for a relatively small delay range.

In the steep region 204, a small variation in the control voltage Vc provides a large delay range. Thus, the VCDL has a very high sensitivity in the steep region 204 because a small noise disturbance on the control voltage Vc results in a large variation in delay resulting in an increase in clock jitter. It is also more difficult to provide stable, non-oscillating loop operation with such a high sensitivity.

In the "optimum region" 200, the change in delay with respect to change in control voltage is moderate. Thus, the DLL 100 operates in the "optimum region" without oscillating, drifting or accumulating noise.

A lock point is any point in the characteristic to which a DLL can lock. There can be a plurality of lock points on the characteristic. The operating point is the lock point to which the DLL is locked during normal operation. One important aspect in designing a DLL is choosing the correct operating point in the characteristic and steering the DLL to reach and lock to that operating point quickly after power-up or reset. This process is typically referred to as DLL initialization. Proper initialization of the DLL ensures good DLL performance and a steady lock.

Selecting the correct operating point sets the control voltage Vc to a target voltage level related to a stable operation region. To ensure stable DLL operation, the DLL should be initialized to an operating point in the "optimum region" 200 of the VCDL delay vs. control voltage characteristic.

After the DLL has reached the operating point, the operating point can move due to changes in operating conditions such as temperature and power supply. Thus, another important aspect of DLL design is to keep the operating point within predetermined limits of the lock point on the delay vs. voltage characteristic while operating conditions change. The variation in the control voltage Vc is limited to the variation in power supply voltage at most, often the variation in the control voltage Vc is smaller than the variation in the power supply voltage. Therefore, the delay vs. control voltage characteristic shown in FIG. 2 is not infinite on both ends and it is possible that as operating conditions change, the operating point can drift to either the left or right limit of the characteristic and the DLL will eventually lose lock. This has a particularly high probability of occurring if the DLL is initialised to an operating point that is too close to either of the two ends of the characteristic.

It is preferable to lock the operating point to a lock point on the left side of the characteristic because this is the region with better noise immunity. However, if the operating point is too close to the left end of the characteristic, it is possible for the DLL to reach the left limit of the characteristic due to changes in operating conditions. This situation is illustrated in FIGS. 3A and 3B.

FIG. 3A is a graph illustrating a lock point 300 that is close to the left end of the control voltage v. delay characteristic. FIG. 3B is a clock signal timing diagram corresponding to the control voltage v. delay characteristic in FIG. 3A. The operating point is at lock point 300 in nominal conditions. A range of delay 302 in the VCDL is required to compensate for variations in operating conditions. Referring to the clock signal timing diagram, the drift in the rising edge of the feedback clock signal CKf 304 corresponds to the range of delay 302 shown in the graph in FIG. 3A. The minimum delay 306 in the delay range 302 is beyond the full range of delays produced by the VCDL 310 as illustrated by the gap in the delay range 308. Thus, the operating point can move to the end of the VCDL range causing the DLL to lose lock.

Another potential risk is for the DLL to start searching for a lock point from a random point on the characteristic during start-up with no restriction on the search direction. As the externally supplied clock signal CK is free running, the initial phase relationship between the feedback clock signal CKf and the reference clock signal CKref after a reset or power-up is not known. Also, after power-up or reset, the position of the initial DLL unlocked operating point is unknown and can be anywhere on the characteristic. Thus, the VCDL delay can be initially increased or decreased dependent on whether the rising edge of the feedback clock signal CKf or the rising edge of the reference clock signal CKref is detected first by the PD 104 (FIG. 1). Therefore, the direction in which the VCDL delay is initially adjusted is unpredictable.

FIG. 4A is a graph illustrating an initial search for a lock point in a search direction that results in hitting the delay limit of the VCDL 102 (FIG. 1) before lock can be reached. FIG. 4B is a clock signal timing diagram corresponding to the search shown in FIG. 4A. The search for the lock point begins at random search point 400. If the DLL starts from a point close to an end of the characteristic and proceeds towards that end, it can hit the delay limit of the VCDL before lock can be reached. In the example shown in FIGS. 4A-4B, during initialization, the DLL unpredictably moves toward the nearest lock point 402 which is beyond the VCDL range and cannot be reached. For example, this situation can occur if the phase detector 104 (FIG. 1) initially produces UP/DOWN pulses that steer the DLL 100 in the direction of the closest lock point 402 that is beyond the VCDL range 310.

The range of the variable VCDL delay in a DLL is also important. Normally, the range of variable VCDL delay is calculated so that the smallest delay corresponds to a clock frequency somewhat higher than that which the DLL specification requires and the largest delay corresponds to a somewhat lower clock frequency. The variable VCDL delay is calculated in order to ensure margins. For a DLL that is designed to operate over a wide clock frequency range, that is, when the clock period is not a constant value and all the possible values are to be accommodated by the same VCDL, the VCDL has to produce an even wider range of delays. As a result, typically there are a number of possible lock points on the VCDL characteristic for a clock signal having a particular frequency. For higher clock frequencies, the VCDL can produce a delay that is longer than a multiple of the clock period. The goal is to lock to the point that can ensure a stable lock condition and low output clock jitter. In most cases, the delay range for the VCDL is chosen so that the number of possible lock points on the DLL characteristic is more than 2 but not more than about 3 to 5. If there are too many lock points they will co-exist together closely on the characteristic and, if disturbed by noise, the DLL can start to jump from one lock point to another, thereby temporarily losing lock.

SUMMARY OF THE INVENTION

In the known art, solutions to ensure steady lock and good performance of a DLL include complicated structures such as dual-loop structures. Multiphase versions of the clock signal or clock inversion in the simplest case are also used. However they are used in order to minimize number of phase taps in the VCDL and/or provide a delay line with a smaller number of stages. The phase taps in turn are used to increase flexibility in synchronization of pipeline stages, but not for the purposes of achieving steady lock and stable performance of the DLL itself.

Typically, designers of DLLs are reluctant to spend much time dealing with such a "secondary" issue as initialisation and they rely on traditional "proven" approaches. Therefore, it is desirable to provide a DLL initialisation method that mitigates the problems of conventional approaches.

We present a method and apparatus for ensuring that a DLL is initialised to the correct operating point, not too close to either end of a delay vs. control voltage characteristic. Initialisation circuitry forces the DLL to search for a lock point always starting from an initial delay corresponding to one end of the delay vs. voltage characteristic, and allowing the DLL to only vary the controlled delay in one direction until the final lock is reached. After the final lock is reached, the DLL can increase or decrease the controlled delay as needed, to dynamically maintain the lock point. According to the method offered by the present invention, the DLL is also forced to skip the first lock point and the process of skipping is made easier and faster by shifting the phase of a DLL internal clock signal.

In certain embodiments of the present invention, a DLL searches for a lock point by starting from the end point of the delay vs. control voltage characteristic that corresponds to the minimum delay. The direction of the search for a lock point during initialization is restricted to delay increase only, that is, a phase detector is forced to produce only a combination of UP and DOWN signal that corresponds to delay increase, depending on internal structure of the phase detector. The DLL increases the delay until it reaches a first lock point. Then, the delayed clock signal's phase is shifted. In one embodiment, the clock signal is inverted. This forces the DLL to skip the first lock point and proceed to the next one. As a result of the phase shift, the phase detector senses the new phase difference between its two input clock signals and starts producing UP and DOWN signals again until the operating point on the characteristic is reached. This results in a total increase of VCDL delay time about equal to the duration of one entire clock period. After the operating point is reached, delay variation can be either increased or decreased. After the DLL is initialized, the DLL compensates for the input clock signal phase drift and for operating conditions variations and thus dynamically maintains a stable lock.

In other embodiments, a DLL searches for a lock point by starting from a point of the delay vs. control voltage characteristic close to the maximum delay. The direction of the search for a lock point during initialization is restricted to delay decrease only, that is, a phase detector is forced to produce only a combination of UP and DOWN signal that corresponds to delay decrease, depending on internal structure of the phase detector. This embodiment applies to cases when delay vs. control voltage characteristic is perhaps somewhat less non-linear than those in the example of FIG. 2 and has a finite maximum delay corresponding to the boundary control voltage value. In other words when the VCDL can work well at both minimum and maximum delays, that is at both of the control voltage boundary values. VCDL output clock inversion and phase shifting in this case can also apply.

A delay locked loop includes a lock detector and an initialization control coupled to an output of the lock detector. The lock detector detects proximity to a lock point. The initialization control varies a delay in one direction from an initial delay. The initialization control skips a first lock point and upon detection of proximity to the first lock point, continues to vary the delay in the one direction to search for an operating point. Upon detecting proximity to the operating point, the initialization control enables both increase and decrease of the delay. The operating point may be the second lock point.

The lock detector may include a plurality of stages with different pre-set time intervals, each stage indicative of lock point proximity with different accuracy. The initialization state may be power-up or reset. The first lock point is skipped by shifting the phase of a clock signal (inverting the signal—in the simpler case). The phase of the clock signal is shifted by a fraction of the period of the clock signal. Voltage controlled delay line tapped outputs are used to shift the phase of the clock signal. The phase of the clock signal may be shifted by performing a phase shift on internal clock signals in the delay locked loop. The internal clock signal may be a voltage controlled delay line input clock signal or a voltage controlled delay line output clock signal.

Lock point proximity is detected based on alignment of edges of a reference clock and a delayed feedback clock. The proximity is analyzed by applying at least one of a plurality of pre-set time intervals. Values of the pre-set time intervals can be based on replicas of stages in a voltage controlled delay line and may be smaller than a quarter of the clock period or a fraction of a delay time between two adjacent voltage controlled delay line tapped outputs.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

In the following description, numerous specific details are set forth to provide a thorough understanding of the invention. However, it is understood that the invention may be practised without these specific details. In other instances, well-known structures or and/or processes have not been described or shown in detail in order not to obscure the invention. In the description and drawings, like numerals refer to like structures or processes. Generally, operation of a Delay Locked Loop (DLL) is well known in the art and will not be described further except where necessary to clarify aspects of the invention.

Figure 5:
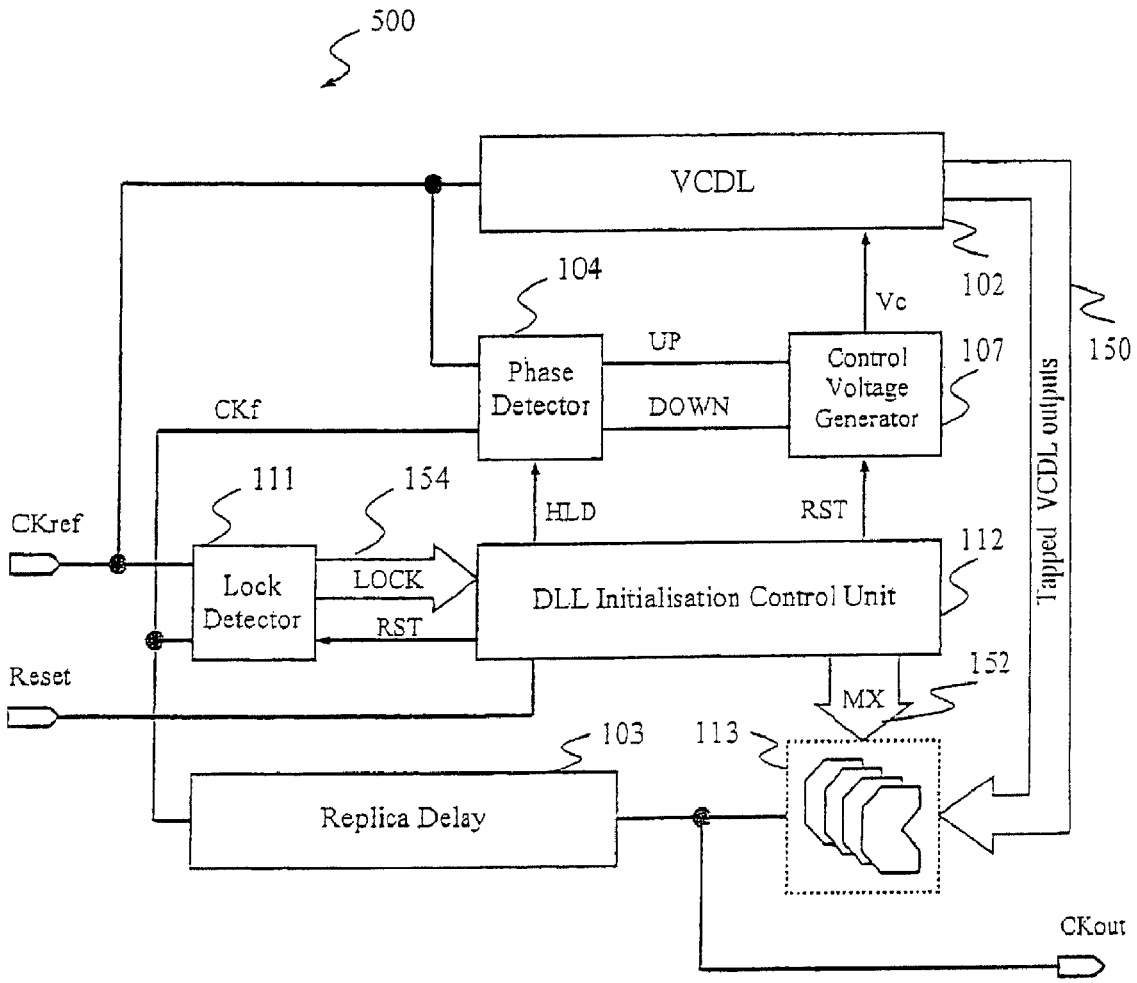
FIG. 5 is a block diagram of an embodiment of a Delay Lock Loop (DLL) that includes a DLL Initialization control for initializing the DLL according to the principles of the present invention.

FIG. 5 is a block diagram of an embodiment of a Delay Lock Loop (DLL) 500 that includes a DLL Initialization control 112 for initializing the DLL 500 after power-up or reset according to the principles of the present invention. The DLL 500 includes a Voltage Controlled Delay Line (VCDL) 102, Phase Detector (PD) 104, control voltage generator 107, and replica delay 103 as described in conjunction with the prior art DLL shown in FIG. 1. The DLL also includes a multiplexer 113, a lock detector 111 and a DLL initialization control 112 used for initializing the DLL 500 after power-up or reset.

A reference clock signal CKref is coupled to the input of the voltage controlled delay line (VCDL) 102, one of the two inputs of the phase detector (PD) 104 and the lock detector 111. The VCDL 102 produces tapped phase shifted output clock signals 116, each of which is a delayed version of the reference clock signal CKref. A DLL output clock signal CKout is selected through multiplexer 113 from the tapped VCDL outputs 116 dependent on an MX Code 152 output from the DLL Initialization Control 112. The output clock signal CKout is, for example, routed to various circuits on a semi-conductor chip through a buffering structure referred to as clock tree.

The feedback clock signal CKf is the version of the reference clock signal CKref delayed by the VCDL 102 and replica delay circuit 103. The feedback clock signal CKf is tapped at a terminal node of a branch of the clock tree. Alternatively it can be obtained by applying the output clock signal CKout to a replica of the clock tree branch, referred to here as the replica delay circuit 103. The feedback clock signal CKf is fed back to the PD 104 and the lock detector 111. The replica delay circuit 103 also known as a delay model or a clock tree branch replica, reproduces all delays added to the CKout signal by the multi-stage buffering structure of the clock tree. The delays include all propagation delays through the logical gates and buffers and delays caused by parasitic impedance of long wires. The feedback clock signal CKf replicates the clock signals at the terminal nodes of clock tree branches. For example, in a semiconductor chip, the clock signals at the terminal nodes are applied to the clock inputs of synchronous blocks and they are normally synchronized with the reference clock signal CKref.

The DLL input or reference clock signal CKref is coupled to the VCDL 102. The VCDL 102 includes a chain of similar buffers with variable delay. The chain can contain tens or even hundreds of buffers. The delay produced by the VCDL 102 is variable and controllable through a variable control voltage Vc applied to each buffer in the VCDL 102 through the control voltage generator 107.

At the beginning of the initialization process, the control voltage Vc is set to a boundary voltage level (end point), that is, to a voltage level at which the delay of VCDL 102 is set to a minimum delay. The boundary voltage level can be for example, the power supply voltage or ground. The RST signal generated by the DLL Initialization Control 112 is coupled to the Control Voltage Generator 107 to set the initial control voltage Vc. The setting of the initial control voltage Vc can be for instance performed by shorting the Vc node to either power supply node (rail) or ground through a single-transistor switch.

The phase detector 104 generates variable width pulses on the UP and DOWN output signals dependent on the phase difference between the reference clock signal CKref and the feedback clock signal CKf. Both clock signals are coupled to the inputs of the phase detector 104. The variable width pulses on the UP and DOWN output signals from the phase detector 104 are integrated by the control voltage generator 107 in order to provide the Direct Current (DC) mode control voltage Vc. In one embodiment, the control voltage generator 107 can include a charge pump 105 and loop filter 106 as described in conjunction with the DLL 100 in FIG. 1. The control voltage generator 107 integrates the PD output signals (UP, DOWN) by applying filtering and voltage level shifting operations as is well-known to those skilled in the art. Embodiments of VCDLs will be described later in conjunction with FIGS. 7 and 8

Co-pending U.S. patent application entitled "High Output Impedance Charge Pump for PLL/DLL," by Dieter Haerle (U.S. Patent Application No. 60/528,958, now U.S. patent application Ser. No. 11/009,534 filed on Dec. 10, 2004, which issued as U.S. Pat. No. 7,176,733, and U.S. Continuation patent application Ser. No. 11/636,876 filed on Dec. 11, 2006), the contents of which are incorporated herein by reference in its entirety describes an embodiment of a charge pump in a control voltage generator. Another example of charge pump can be found in "A 2-1600 MHz 1.2-2.5V CMOS Clock Recovery PLL with Feedback Phase-Selection and Averaging Phase-Interpolation for Jitter Reduction," Patrik Larsson, 1999 IEEE ISSCC, WA 20.6, 0-7803-5129-0/99, FIG. 20.6.3, the contents of which are incorporated herein by reference in its entirety.

The phase detector 104 can be any phase detector that produces output signals (UP, DOWN) that are proportional in an electrical characteristic (for example, voltage level or pulse width) to the phase difference between the clock signals applied to the inputs (CKref, CKf). Phase Detectors are well-known to those skilled in the art and beyond the scope of the present invention. Examples of Phase Detectors are described in "An All-Analog Multiphase Delay-Locked Loop Using a Replica Delay Line for Wide Range Operation and Low-Jitter Performance," Yongsam Moon et al., JSSC Vol. 35, No. 3, Mar. 2000, pp 377-384, incorporated herein by reference in its entirety.

The ability to vary the delay produced by the VCDL 102 is used by the DLL 100 to synchronize the reference clock signal CKref and the feedback clock signal CKf by aligning their respective rising edges. The control voltage Vc determines the delay to be added to the reference clock signal CKref by the VCDL 102 to align rising edges of the feedback clock signal CKf and the reference clock signal CKref.

The reference clock signal CKref and the feedback clock signal CKf are also coupled to the inputs of the lock detector 111. The lock detector 111 evaluates mutual positioning of the rising edges of the input clock signals (CKref, CKf) and generates a LOCK indication signal 154 that is indicative of the timing difference between the rising edges of the two clock signals. The LOCK indication signal 154 can be a single-bit signal or a multi-bit code. The internal structure and operation of an embodiment of the lock detector 111 will be discussed later in conjunction with FIG. 9.

The multiplexer 113 is any suitable type of multiplexer known in the art that selects one of a number of input signals (tapped VCDL outputs 116 in this description) to be transmitted to its single output (Ckout in this description) according to the value of a multi-bit code (MX 152). The tapped VCDL outputs will be described later in conjunction with FIGS. 7 and 8.

The DLL initialization control 112 manages the initialization process, and is responsible for maintaining the proper sequence of the initialization process. The DLL initialization control 112 also selects appropriate values for codes (MX 152) and signals (HLD, RST) based on the LOCK indication signal 154 received from the lock detector 111.

After power up or reset, the DLL Initialization control 112 asserts the RST signal to reset the lock detector 111 and the control voltage generator 107. The control voltage Vc output from the Control Voltage Generator 107 is set to the voltage level that provides the minimum VCDL delay. The DLL Initialization Control 112 also asserts the HLD Signal coupled to the phase detector 104. While the HLD signal is asserted, the phase detector 104 can only increase the delay of the VCDL 102 by generating the appropriate UP/DOWN signals. Upon detecting from the state of the lock indication signal 154 that the operating point is close to a first lock point, the DLL Initialization Control Unit 112 outputs the appropriate MX code 152 to switch the phase of the output clock signal CKout. After the phase has been switched, the phase detector 104 continues to increase VCDL delay by modifying the control voltage Vc through generating the appropriate UP/DOWN signals until the next lock point is reached, as indicated by the lock indication signal 154.

The multiplexer 113 has multiple inputs and a single output. The MX code 152 selects one of the tapped VCDL output signals to be passed through to the single output. Only one tapped VCDL output signal can be passed to the multiplexer output at a time, the one that corresponds to the current value of the MX code. There is a limited number of delay stages between the adjacent tapped VCDL outputs, thus, the multiple tapped VCDL outputs create a "phase grid" in which the phase difference between two adjacent tapped signals is relatively small, a fraction of the clock signal period. With the small phase difference between the adjacent taps, a relatively large number of taps must be skipped in order to produce a larger phase shift. Thus, the complements of the tapped VCDL signals are used if the required phase shift at the output of the multiplexer is close to 180 degrees (big hop) and if needed more precise adjustment may be performed afterwards using the small phase difference between taps (smaller hops).

After the next lock point is reached, the initialization process is complete. The DLL initialization unit 112 de-asserts the HLD signal and the phase detector 104 can increase or decrease the delay of the VCDL 102 during normal operation of the DLL.

Thus, the DLL Initialization Control unit 112 controls the initialization process so that the VCDL delay starts at the minimum delay, the delay increases to the first lock point, the first lock point is skipped and the delay is further increased until the DLL 500 is locked at the second lock point. Further details of the operation of the DLL initialization control unit 112 will be discussed later in conjunction with FIG. 11.

Figure 6A:
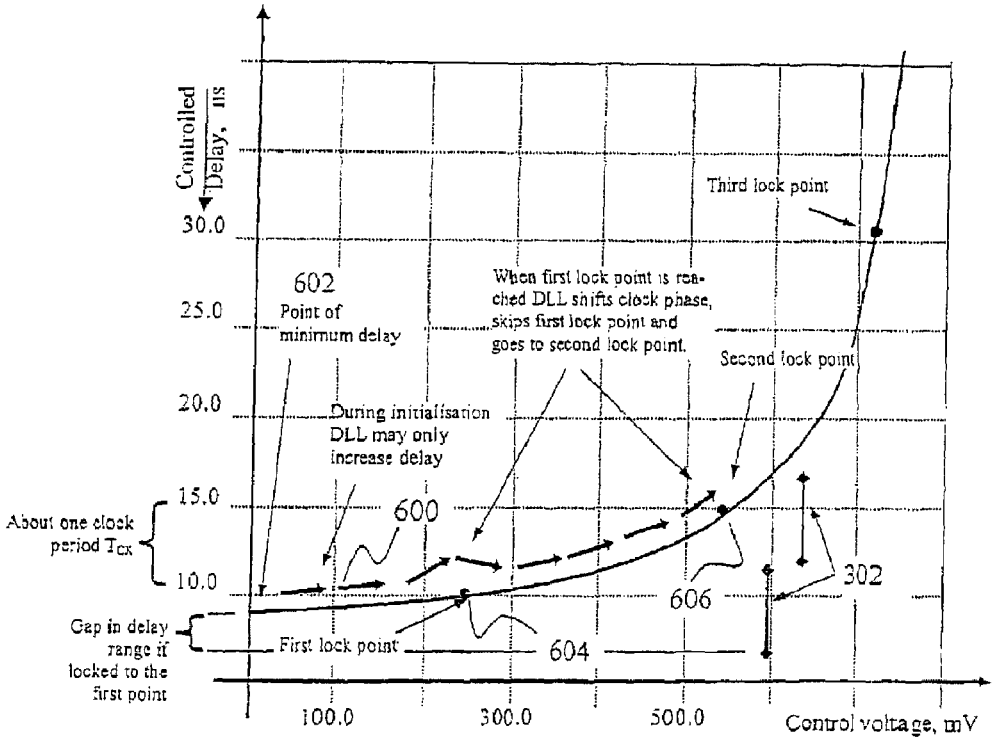
FIG. 6A is a graph illustrating the initialization process on the control voltage v. delay characteristic using the DLL Initialization control in the DLL shown in FIG. 5.
Figure 6B:
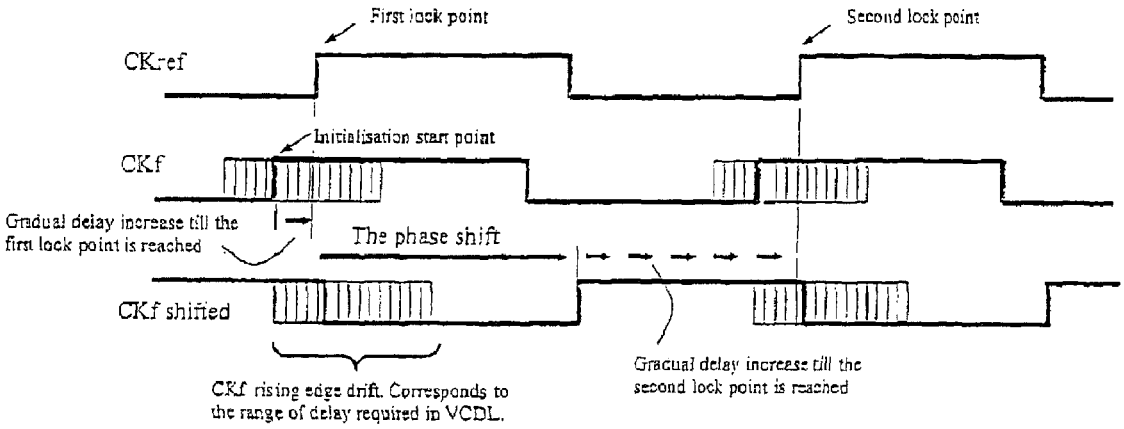
FIG. 6B is a clock signal diagram corresponding to the initialization process shown in FIG. 6A.

FIG. 6A is a graph illustrating the initialization process on the control voltage vs. delay characteristic using the DLL 500 shown in FIG. 5. FIG. 6B is a clock signal diagram corresponding to the initialization process shown in the characteristic in FIG. 6A. FIGS. 6A and 6B will be described in conjunction with FIG. 5.

The control voltage Vc is initially reset to a boundary voltage level, that is, to the voltage corresponding to the smallest delay produced by the VCDL 102. The boundary voltage level can be for example, the power supply voltage or ground.

After reset or power-up, as the control voltage Vc is increased based on the UP/DOWN signals output from the PD 104, the Voltage Controlled Delay Line (VCDL) 102 starts increasing delay in direction 600 from the minimum delay point 602 (the left-most point on the delay vs. control voltage characteristic) shown in FIG. 6A.

At the start of the initialization process, the lock detector 111 evaluates the relative positions of the rising edges of the two clock signals (CKref, CKf). Based on the evaluation, the lock detector 111 produces a LOCK signal 154 which is indicative of the proximity of the two clock signal rising edges. In one embodiment, the LOCK signal 154 is a multi-bit code. The LOCK signal is received by the DLL Initialization Control Unit 112. The DLL initialization control unit 112 generates a multi-bit output selection code MX 152 based on the value of the LOCK signal 154. The output selection code MX 152 is used to select one of the tapped phase-shifted output signals 116 received from the VCDL 102.

The delay through the VCDL 102 is gradually increased in one direction from the minimum delay point 602. During initialization, a HLD signal output from the DLL Initialization Control unit 112 and coupled to the PD 104 is asserted to hold the PD 104 in an initialization state. While in the initialization state, the PD produces only an UP or a DOWN signal so that the VCDL delay is only increased by appropriate modification of the control voltage Vc. The initialization process continues until the rising edges of the reference clock signal CKref and the feedback clock signal CKf are aligned with a pre-set degree of proximity. The degree of proximity is set to be substantially less than half of the period of the reference clock signal CKref.

After detecting that the rising edges of the reference clock signal CKref and the feedback clock signal CKf are aligned to the selected degree of proximity, the output clock signal CKout is inverted (that is, shifted 180 degrees for a 50% duty cycle clock signal) through appropriate selection of the output selection code MX 152 by the DLL initialization control unit 112. Thus, the first lock point 604 is skipped. The HLD signal controlled by the DLL Initialization Control Unit 112 continues to hold the PD 104 in the initialization state resulting in continued increase of the VCDL delay.

After the first lock point 604 has been skipped, the DLL 500 continues increasing the delay by gradually increasing the control voltage Vc, until an accurate alignment of the rising edges of the reference clock signal CKref and the feedback clock signal CKf is reached. The accurate alignment is indicated either by the LOCK signal 154 or by the state of the PD 104 UP and DOWN output signals. If PD 104 is used as the fine alignment indicating device in the initialization process as mentioned in previous sentence, PD 104 can have a pair of separate UP and DOWN outputs dedicated for the initialization and not coupled to the inputs of the control voltage generator 107. Depending on PD 104 scheme this might be necessary because UP and DOWN outputs connected to the inputs of the control voltage generator 107 may be disabled during initialization.

After the second lock point 606 is reached, the state of the HLD signal is switched to de-asserted to allow normal operation of the PD 104. The DLL 500 is then allowed to increase or decrease the VCDL delay as needed. By releasing the PD 104, the initialization process is terminated and normal operation of the DLL is enabled.

In one embodiment, the lock indication signal 154 is a multi-bit lock code. The multi-bit LOCK code 154 allows the DLL 500 to quickly move towards the desired lock point by selecting the tapped VCDL output 116 that corresponds to the desired lock point 606. This allows the second (desired) lock point 606 to be reached quickly, without having to wait for the control voltage Vc to be gradually changed. In an alternate embodiment, the LOCK signal 154 is a single bit.

Figure 7:
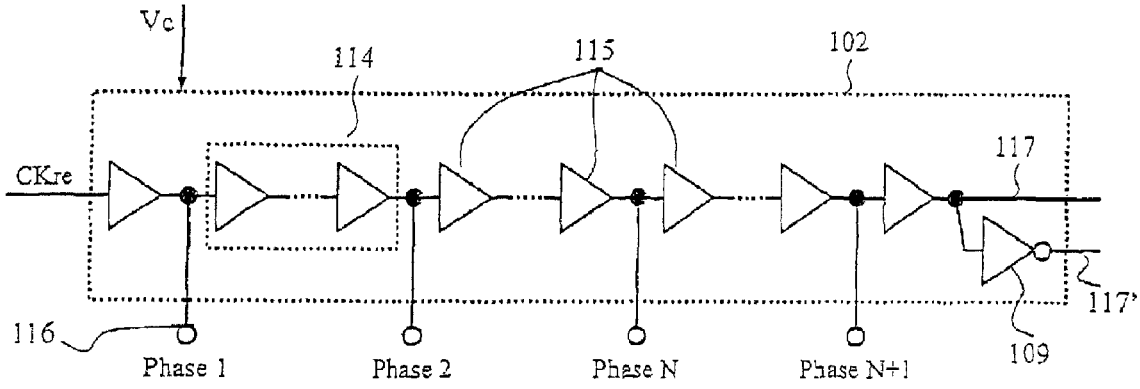
FIG. 7 is a block diagram of a single-ended embodiment of the VCDL shown in FIG. 5.

FIG. 7 is a block diagram of a single-ended embodiment of the VCDL 102 shown in FIG. 5. The VCDL 102 includes a plurality of single-ended buffers 115 connected in series to provide a delay line. Each buffer 115 has a single-ended input and a single-ended output. The single ended output of one buffer 115 is coupled to the single-ended input of a subsequent buffer in the VCDL 102. The control voltage Vc is supplied directly to each buffer 115 and determines the delay time produced by each buffer. Connection of the control voltage Vc to each buffer 115 is not shown in FIG. 7 for simplicity. In this embodiment, the VCDL output signal 117 is also single-ended. The inverted version (shifted by 180 degrees for a 50% duty cycle clock) of the VCDL output signal 117' is provided through the output of an inverter 109, the input of which is coupled to the VCDL output signal 117.

Intermediate delayed versions of the reference clock signal CKref are obtained by tapping outputs of a group of buffers 114. The plurality of taps 116 constitute the tapped VCDL outputs 116 shown in FIG. 5. Each tap 116 is a delayed or phase-shifted version of the reference clock signal CKref. In different embodiments of present invention the VCDL 102 can output a plurality of tapped outputs 116 or a single output signal 117 with or without its respective complement 117'.

Figure 8:
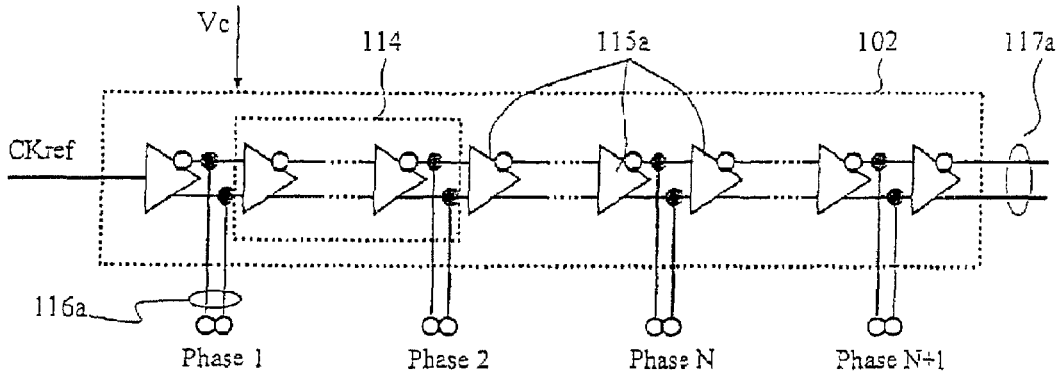
FIG. 8 is a block diagram of a differential-ended VCDL.

FIG. 8 is a block diagram of a differential-ended embodiment of a VCDL 102. In this embodiment, the VCDL 102 includes a plurality of differential buffers 115a controlled by control voltage Vc that is coupled to each differential buffer 115a (not shown for simplicity). The differential buffers 115a are connected in series. In this embodiment, differential buffers 115a have differential inputs and differential outputs. The first buffer 115b has a single ended input for receiving the single-ended reference clock signal CKref and a differential output. The differential-ended embodiment of the VCDL 102 tends to have better noise immunity than the single-ended embodiment of the VCDL. Also, the VCDL output 117a and every tapped output 116a has both the signal and its complement. With the complement of each tapped output signal provided, there is no need for the inverter 109 shown in the single-ended embodiment in FIG. 7. VCDL 102 can have either a plurality of tapped differential outputs 116a or a single differential output 117a.

Figure 9:
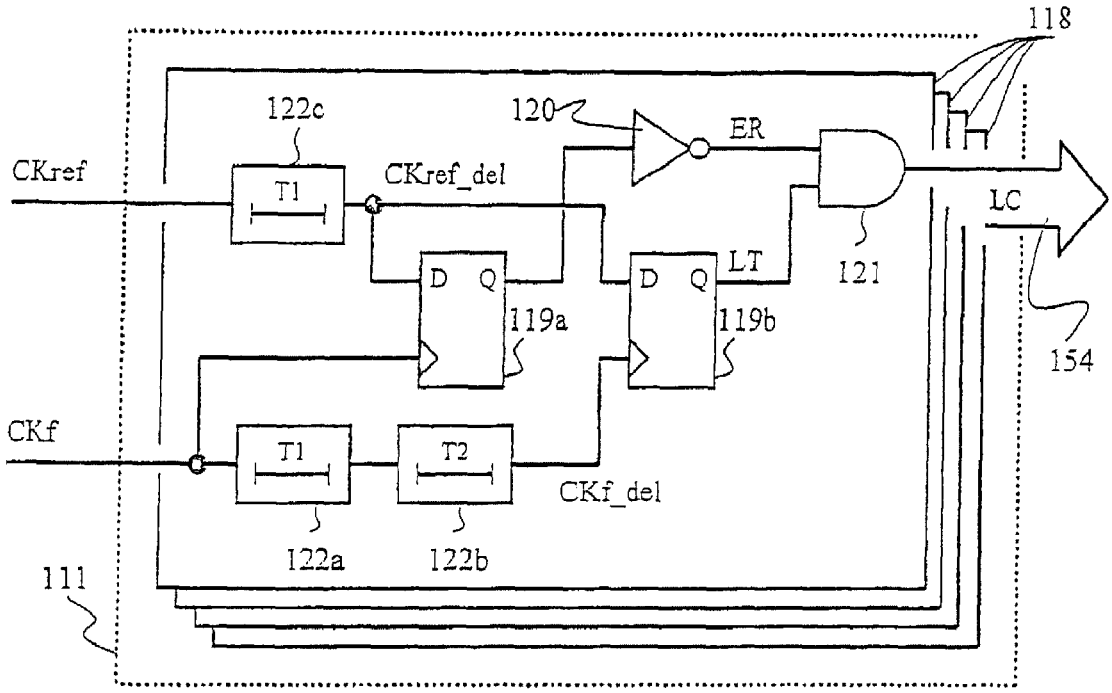
FIG. 9 is a schematic of an embodiment of a lock detector.

FIG. 9 is a schematic of an embodiment of a lock detector 111. The lock detector 111 provides a lock indication signal (LC) 154 that indicates how close the DLL is to a lock point based on the phase difference between the reference clock signal CKref and the feedback clock signal CKf. Each stage 118 in the lock detector 111 receives two clock signals (CKref, CKf) at the input and outputs a single-bit LOCK signal (LC) indicative of the time difference between the rising edge of one of it's input clock signals and rising edge of it's other input clock signal.

Each stage 118 is a self-containing unit that includes two flip-flops 119a, 119b and three delay lines 122a, 122b, 122c. Each of the delay lines 122a, 122b, 122c has a respective delay time interval (T1, T2) that is embedded in the delay line. In the simplest implementation, the lock detector 111 has a single stage 118 that outputs a single bit lock indication signal.

Figure 10:
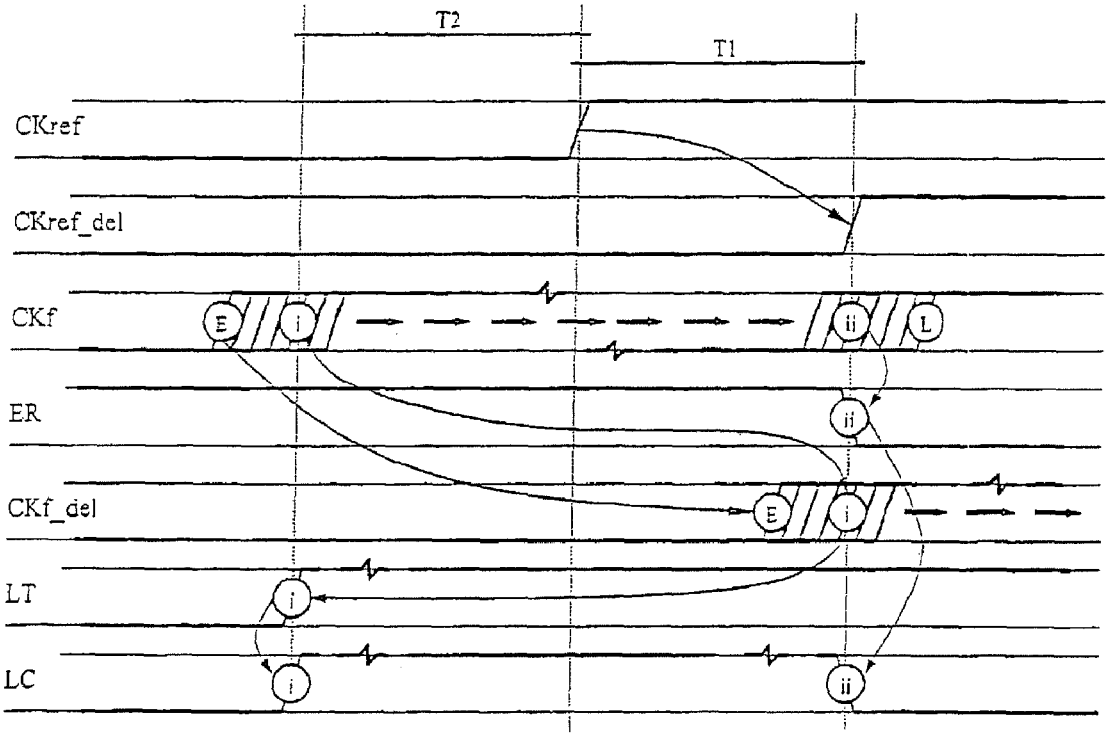
FIG. 10 is a timing diagram illustrating signals in one of the stages of the lock detector shown in FIG. 9.

FIG. 10 is a timing diagram illustrating signals in one of the stages of the lock detector 111 shown in FIG. 9. FIG. 10 will be used in conjunction with FIG. 9 to explain the operation of the lock detector 111. The position of the rising edges of the reference clock signal CKref and the position of the rising edges of a delayed reference clock signal CKref_del are assumed to be stable. The timing diagram illustrates the movement of the rising edge of the feedback clock signal CKf from left to right, from an "early" ('E') position to a "late" ('L') position. The E position is prior to the rising edge of the reference clock signal CKref and the L position is after the rising edge of the delayed reference clock signal CKref_del.

Referring to FIG. 9, in each stage 118, the input clock signal CKref of the stage 118 is delayed by delay line 122c having a delay time T1. The delayed input clock signal CKref_del is coupled to the "D" input of flip-flops 119a, 119b. The clock input of flip-flop 119a is coupled to the feedback clock signal CKf. The clock input of flip-flop 119b is coupled to a delayed feedback clock CKf_del that has been delayed through delay line 122a having a delay time interval of T1 and delay line 122b having a delay time interval of T2. The delay lines 122a, 122b are connected in series.

The delay time intervals T1 and T2 are embedded in the delay lines 122a-c, and can be same value or different. The delay time intervals can also be modified depending on the application. In general, the lock detector 111 includes a plurality of stages 118 of similar structure as described in conjunction with FIG. 9. However, for different implementations, stages 118 can differ in the T1 and T2 delay values embedded in the delay lines 122a-c. The preferred value for both T1 and T2 is a fraction of the period of the reference and feedback clock signals (CKref, CKf), with the fraction being smaller than a quarter of the clock period at the highest clock signal frequency. In some embodiments, the delay time interval is shorter than a half of the delay time between two adjacent VCDL taps 116, 116a. For other embodiments, the delay time interval is slightly longer than half of the delay time between two adjacent VCDL taps 116, 116a.

In the embodiment shown, delay time intervals T1 and T2 are different. If the rising edge of feedback clock signal CKf is expected to "approach" the rising edge of the reference clock CKref during initialization from one side (e.g., left of FIG. 6 timing diagram), delay time interval T2 "opens the lock window" and delay time interval T1 constitutes the margin for the lock detector. Generally, T1 and T2 are different values. In this example typically, delay time interval T1 is selected to be less than delay time interval T2, to ensure "early warning" that the lock point is approaching and tighter control on the other side of the lock point.

Typically, delay time intervals (T1, T2) are short because it takes significant silicon area overhead to obtain longer delays. However, the delay time intervals cannot be too short because the LC signals 154 need to stay stable during a number of clock cycles while the VCDL delay is adjusted by the DLL 500.

Referring to the schematic in FIG. 9, when the rising edge of the feedback clock signal CKf is in the "E" position, the rising edge of the feedback clock signal CKf is early with respect to the reference clock signal CKref. The LC signal 154 is '0' because the ER signal at the output of inverter 120 is '1' and the LT signal at the Q output of flip-flop 119b is '0'.

The ER and LT signals are combined by AND logic gate 121 to provide LC signal at the output. The combination of a '0' on the LT signal and a '1' on the ER signal, results in a '0' on the LC signal at the output of AND logic gate 121.

As the VCDL delay is increased, the feedback clock signal CKf rising edge moves towards the right and reaches the "i" position. The LC signal switches to '1' because the both the 'ER' signal and the 'LT' signal are '1'.

Referring to the schematic, the delayed feedback clock signal CKf_del also reaches its respective "i" position. At the rising edge of the delayed feedback clock signal CKf_del, the delayed reference clock signal CKref_del is '1' and the '1' on the D input of flip-flop is latched to the Q output of flip-flop 119b. The combination of a '1' on the LT signal and a '1' on the ER signal, results in a '1' on the LC signal at the output of AND logic gate 121'.

The LC signal remains at '1' while the position of the rising edge of the feedback clock signal CKf continues to move to the right in example of FIG. 10 until the rising edge reaches the "ii" position. At the 'ii' position, the delayed reference clock CKref_del is '1' because the D input of flip-flop 119a is '1', the next rising edge of the feedback clock CKf clocks a '1' to the Q output of flip-flop 119a and the ER signal at the output of inverter 120 switches to '0'. The combination of a '1' on the LT signal and a 01' on the ER signal, results in a '1' on the LC signal at the output of AND logic gate 121'.

The state of the LC signal provides an indication of the time between the rising edge of the feedback clock CKf and the rising edge of the reference clock CKref. The LC signal remains '1' while the rising edge of the feedback clock signal CKf is within time T2 and T1 from the rising edge of the CKref clock signal, that is, between position (i) and (ii).

If a plurality of stages 118 are included in the lock detector 111 and each stage receives the same feedback clock signal CKf and a different tap 116 of the reference clock signal CKref from the VCDL 102, the tap of the reference clock CKref whose rising edge is closest to the rising edge of the feedback clock signal CKf can be easily identified. One method is to let the DLL continue to advance the rising edge of the feedback clock CKf, that is, increase the VCDL delay by gradually changing the control voltage Vc value and monitor which of the plurality of LC signals switches to '1'.

Another method is to monitor both the ER and LT signals directly instead of the LC signal. The combination of the ER and LT signals provides four possible states (00, 01, 10 and 11). The state is '10' (the ER signal is '1' and the LT signal is '0) when the rising edge of the feedback clock signal CKf is more than T2 earlier than the rising edge of the reference clock signal CKref. The state is '01' (the ER signal is '0' and the LT signal is '1') when the rising edge of the feedback clock CKf is more than T1 later than the rising edge of the reference clock signal CKref. Thus, if the rising edge of a feedback clock CKf is later then the rising edge of the reference clock CKref at the VCDL tap 116, 116a with order number "N", but the rising edge of the feedback clock signal CKf is earlier than the rising edge of the reference clock signal CKref at the next tap 116, 116a with order number "N+1", the state (ER and LT signal combination) at tap "N" is "11" or "01" and the state (ER and LT signal combination) at tap "N+1" is "10" or "11". If values T1 and T2 are both chosen as a small portion of the time delay between adjacent taps, for example, one tenth of the time delay between the two adjacent taps N, N+1, the "11" combination is never present at two adjacent taps simultaneously and it is easy to see that the lock point (state '11') is between the two taps.

The method using only a single LC signal output from each stage 118 is simpler to implement than the method using the ER and LT signals. However, the method using the combination of the ER and LT signals is a faster method for bringing the DLL to a lock point. One skilled in the art will understand that in an alternate embodiment, a combination of all three signals: LC, LT and ER can also be used to initialize the DLL operating point.

Figure 11:
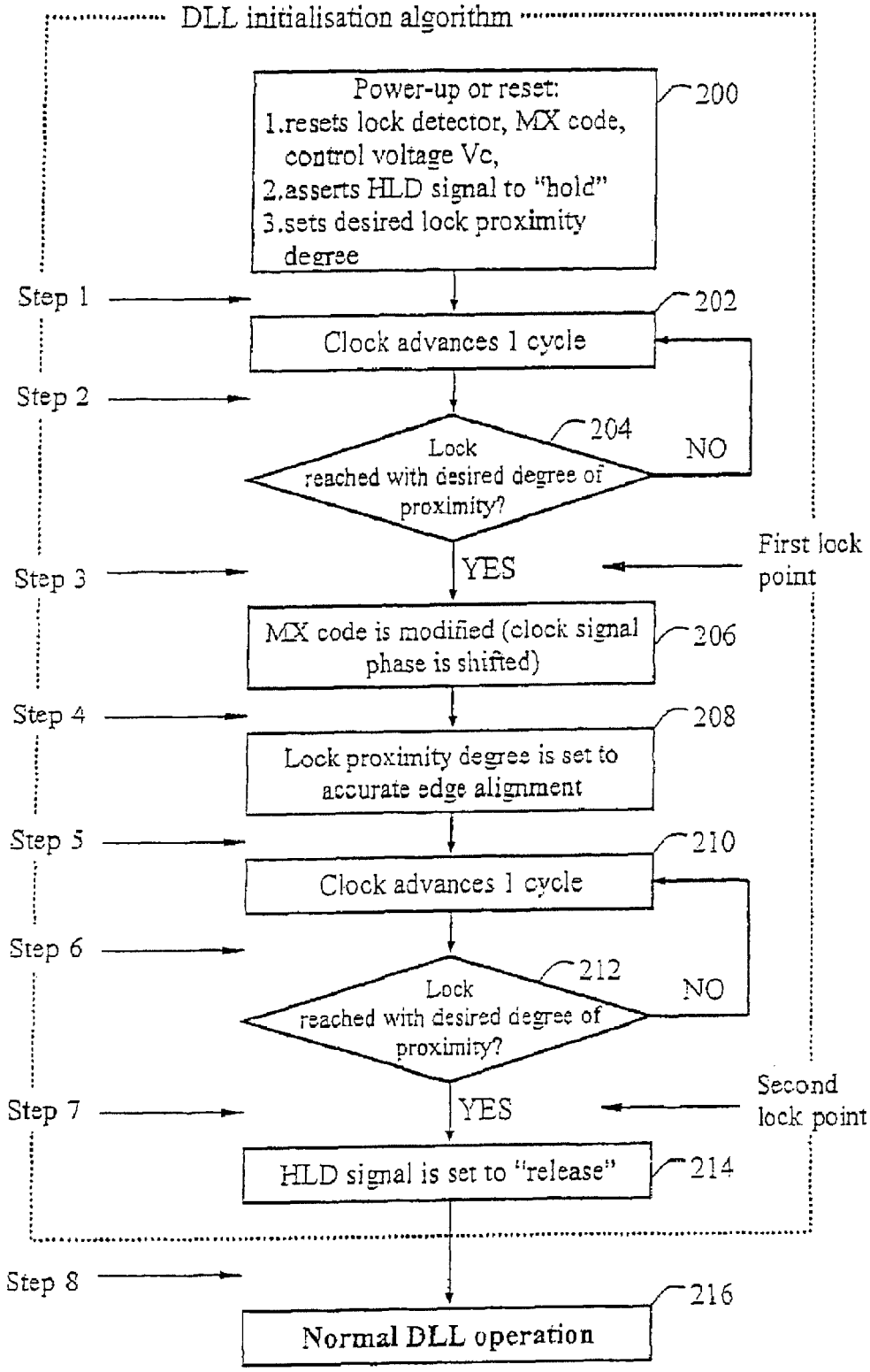
FIG. 11 is a flow chart illustrating an algorithm for initializing the DLL.

Returning to FIG. 5, the DLL initialization control 112 controls the initialization process. The initialization control 112 is a state machine. The process includes choosing the correct values for applied signals (RST, HLD, MX) during the DLL initialization process. Those skilled in the art understand that there are many ways to implement or synthesize a state machine. Therefore an algorithm used for synthesizing the state machine with the desired functions of the DLL initialization control 112 is described rather than a schematic or elements of the internal structure of the DLL initialization control itself. It is also noted that the algorithm discussed here and represented in FIG. 11 is not the only logical scheme that can be used to implement the initialization process. The sequence of the steps can be changed and steps can be added, removed or modified.

FIG. 11 is a flowchart illustrating the DLL initialization process implemented in the DLL initialization control 112. The DLL initialization process starts each time a power up or system reset occurs. FIG. 11 will be described in conjunction with FIG. 9 and FIG. 5.

At step 200, referring to FIG. 5, the system Reset signal (not shown for simplicity) is coupled to the DLL 500 and to various modules within the DLL 500. The RST signal is input to the lock detector 111 and the control voltage generator 107. The RST signal resets the lock detector 111, if necessary. For example, the reset signal can reset the lock detector 111 when coupled to the clear inputs of flip-flips 119a, 119b by clearing both flip-flops 119a, 119b shown in FIG. 9 so that the respective Q output of each flip-flop is set to '0'. The reset signal also discharges the control voltage node Vc to the boundary value, that is, the value that produces minimum delay. The reset signal also asserts the HLD signal to a "hold" mode, sets the initial value for the MX control code 152 and the desired degree of proximity for the searched lock point.

At power up, the MX code value 152 is set to the initial value so that the VCDL tapped output 116 or 116a with minimum phase shift (left most tapped output (phase 1) shown in FIGS. 7 and 8) is selected. The desired lock proximity degree is set by selecting the lock detector 111 instead of the PD 104 as the device to evaluate the degree of proximity of the rising edges of the clock signals (CKref, CKf).

The value of the MX output 152 from the DLL Initialization Control 112 at power up can differ depending on the implementation. The MX output 152 can be either single or multi-bit. In the embodiment shown in FIG. 5, MX is a multi-bit code. Single and multi-bit implementations will be discussed later. While the HLD signal is set to "hold", the PD 104 is in "hold mode" and the PD 104 controls the UP and DOWN output signals so that the VCDL 102 delay can only be increased. While the PD 104 is in "hold mode", its separate dedicated output signals can still be used to measure with higher accuracy the proximity of the rising edges of the input clock signals (CKref, CKf).

Even the most accurate Phase Detector registers the edge alignment with a certain finite accuracy. This accuracy among other factors determines the accuracy of the DLL clock alignment. For example, if the PD error is 20 ps and the DLL is in steady lock, clock edges are within 20 ps from each other, other factors excluded. The PD output signals therefore indicate alignment of the clock edges when the time difference between the clock edges is 20 ps or less.

The initialization of the DLL starts with the minimum VCDL 102 delay and the delay can only be increased. Returning to FIG. 11, at step 202, the clock (CKref, CKf) advances one cycle (that is, one clock period) and the alignment of the rising edges of the clocks (CKref, CKf) in the respective clock cycle is measured by the lock detector 111 and/or PD 104 as previously discussed.

At step 204, the DLL Initialization Control 112 determines if the lock has been found with the desired degree of proximity based on the LOCK code 154 (FIG. 5) forwarded from the lock detector 111 (FIG. 5). The lock proximity degree is the accuracy to which the lock point is found. The lock proximity degree is stored in the DLL initialization Control 112 as a loadable code in a register or a fuse programmed code. The lock proximity degree is used to set values for the T1 and T2 time intervals in the lock detector 111.

The lock detector 111, as previously discussed, can either determine a rough alignment or an accurate alignment, that is degree of proximity (rough or accurate) of the rising edges which is determined by the T1 and T2 time interval values settings and whether the ER, LT, LC signals or their combination is used to select the lock point.

The alignment accuracy can vary during the DLL initialization process. In the beginning of the initialization process it is sufficient to detect alignment roughly. The rough alignment is typically performed by the lock detector 111 as described in conjunction with FIGS. 9 and 10. At the start of the DLL initialization process, when approximate edge alignment is satisfactory, lock detector stages 118 with long T1 and T2 time intervals and a simple LOCK code are used. When more accurate alignment is required, shorter T1 and T2 time intervals and a more complex combination of ER, LT and LC signals in the LOCK code is used. Alternatively, PD 104 can engage at this stage as the edge alignment detector.

Continuing the initialization process: at each rising clock edge DLL evaluates the degree of proximity (alignment) between the rising edges of the clock signals and produces corrective signals. The control voltage Vc is constantly modified based on the values of UP, DOWN signals from the phase detector 104.

After a few initial clock cycles, the LOCK code settles indicative of DLL approaching the first lock point. After the first lock point has been reached with the desired degree of proximity, process continues with step 206.

At step 206, the first lock point is skipped by modifying the MX code so that the phase of the feedback clock signal CKf is shifted through the multiplexer 113. The VCDL delay can also be increased quickly by performing a phase shift after only a very few clock cycles immediately following power up or reset. In this case an accurate lock detector with high granularity VCDL tapping is used which allows for fast and accurate location of the first and second lock points 604, 606 which in turn allows the value of MX code corresponding to the second lock point to be produced quickly.

Referring to the timing diagram of FIG. 6B and graph of FIG. 6A, after having reached and skipped the first lock point 604, the delay continues to be increased by modifying the value of the control voltage Vc so that DLL moves towards the next, second lock point 606. The delay is initially increased quickly by shifting the phase, the delay is then increased gradually, by modifying the control voltage Vc gradually—a relatively small change on each clock cycle. The timing diagram also shows that the second lock point 604 is reached by gradually increasing the VCDL delay. Gradually changing the value of the control voltage Vc is slower than a phase-shift, however it still increases the VCDL delay and allows the DLL to reach the control voltage Vc value corresponding to the second lock point.

The DLL can be brought to the final lock point (for example, second lock point 606) in single phase-shift with the control voltage Vc set to a value corresponding to the VCDL minimum delay. To perform this operation, a tap 116, 116a is selected so that the DLL skips the first lock point and lands very closely to the second lock point with Vc held to produce minimum delay. However, after Vc is released as operation conditions change, the DLL will not have much room for decreasing the delay, because the control voltage Vc is not too far from the value that produces minimum delay. Thus, the DLL will easily lose lock should significant delay decrease be required to compensate for drift of clock signals edges and change of operation conditions.

Figure 3A:
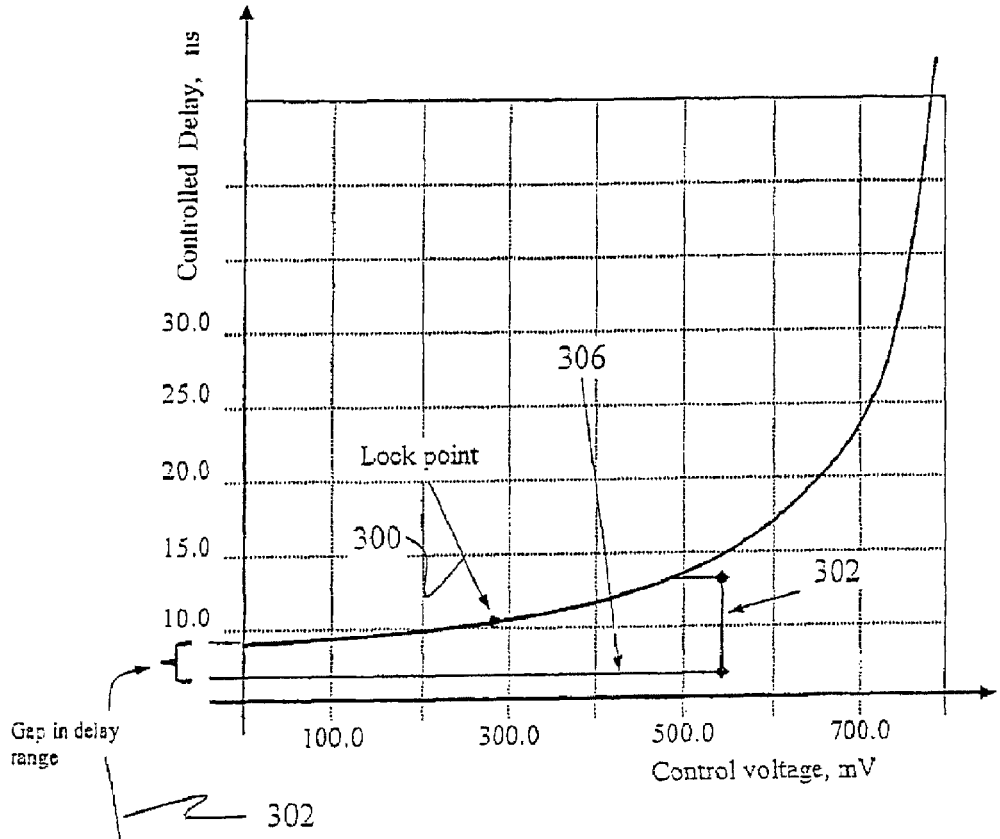
FIG. 3A is a graph illustrating a lock point that is close to the left end of the control voltage v. delay characteristic.
Figure 3B:
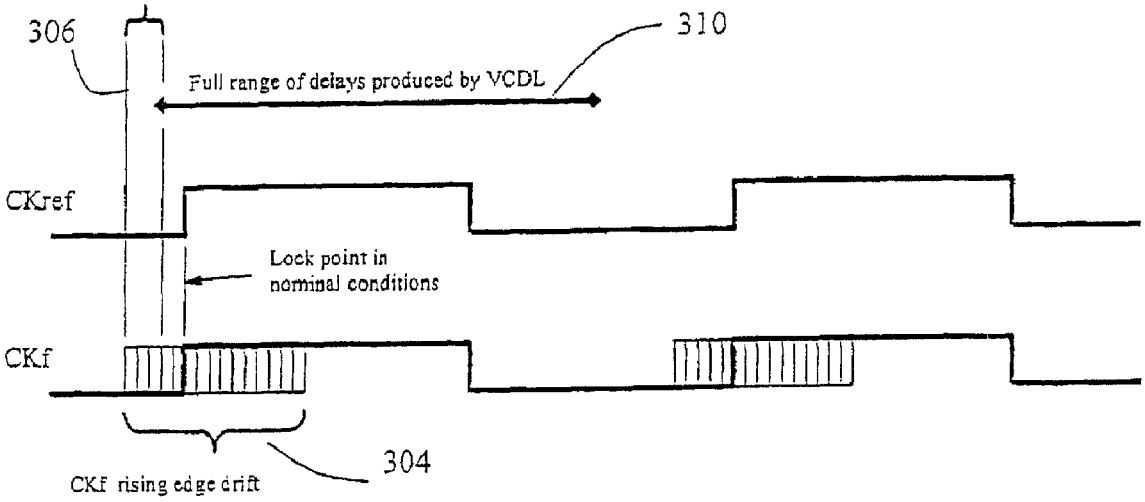
FIG. 3B is a clock signal diagram corresponding to the control voltage v. delay characteristic in FIG. 3A.
Figure 4A:
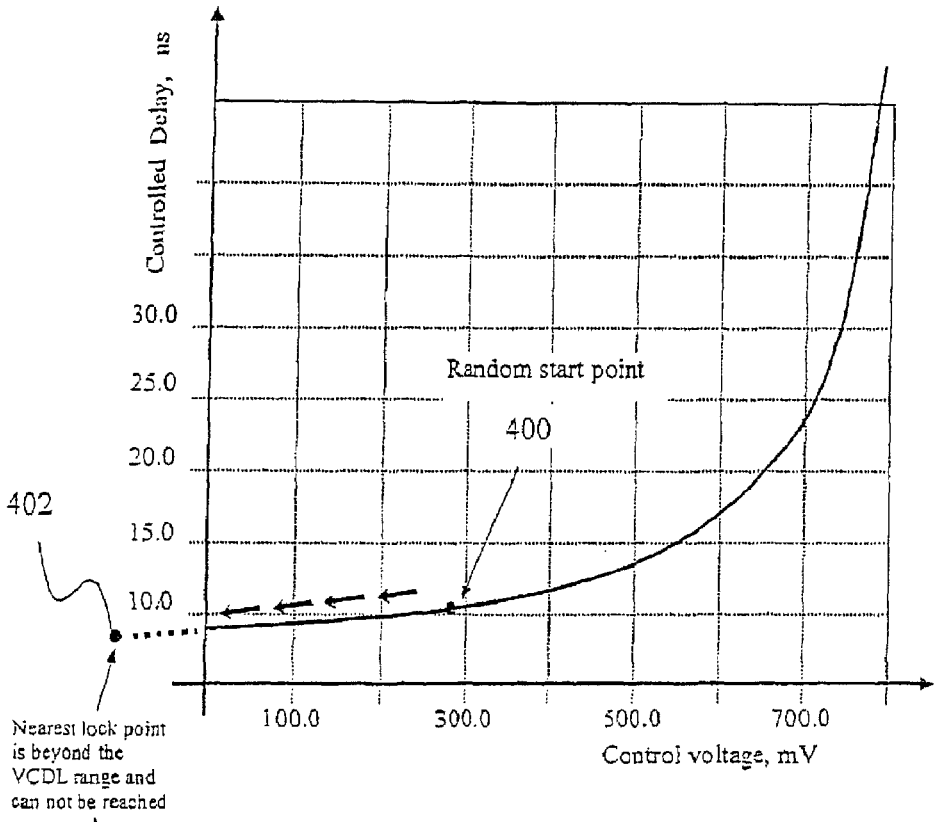
FIG. 4A is a graph illustrating a search for a lock point in a search direction that results in hitting the delay limit of the VCDL before lock is reached.
Figure 4B:
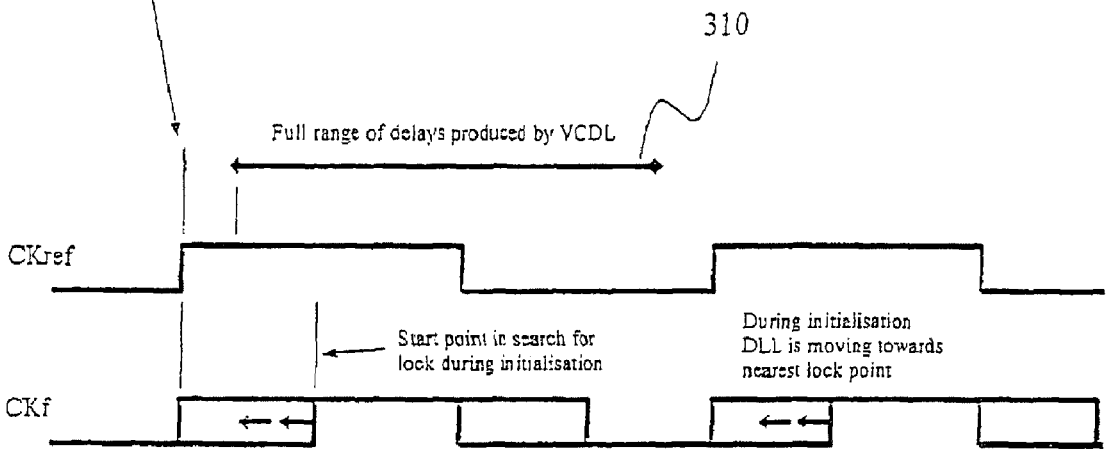
FIG. 4B is a clock signal diagram corresponding to the search for a lock point shown in FIG. 4A.

The part of VCDL delay increase achieved before the final lock due to the Vc voltage level modification only needs to be greater or at least equal to the maximum VCDL delay decrease required during DLL normal operation (range 304 in FIG. 3B) plus some safety margin. Obviously, choosing a longer timing interval will make the search for the final lock longer too. However, as already discussed, the timing interval is determined by maximum VCDL delay modification (decrease) that might be needed at any time during normal DLL operation under influence of the clock signals edges drift and change in operating conditions.

In one embodiment, the lock detector 111 includes a plurality of stages 118 with only the LC outputs of each respective stage 118 used in the lock detector 111 output LOCK code. The stages 118 in this embodiment have different values of the T1 and T2 delay times embedded in their respective delay lines 122a-c. The delay lines 122a-c in this case are replicas of portions of the VCDL 102 buffer chain 114. The first stage 118a has a smaller number of the buffers in delay lines 122a-c and the LC signal of the next stage is asserted (set to logic '1') when rising edges of the reference clock signal CKref and the feedback clock CKf are closer to each other.

Each next stage 118b has more buffers compared to the previous stage. Thus, the degree of proximity in each next stage 118b is less accurate (rougher) and the respective LC output is asserted (set to logic '1') when the rising edges of the clock signals (CKref, CKf) are further away from each other. The combined LC outputs from all stages, that is, the LOCK output code of the lock detector 111 in this embodiment. The LOCK code is indicative of how many single VCDL buffers need to be added to the reference clock signal CKref path in the VCDL in order to bring rising edges of the clock signals CKref and CKf close to each other. In other words, the LOCK output code 154 identifies the tap to be selected from the tapped VCDL outputs by the MX code 152 in order to skip the first lock point 604 to bring the DLL operating point close to the second lock point 606.

Thus, at step 208, the DLL initialization control 112 changes the desired proximity degree to accurate by asserting the MX code value that corresponds to the second lock point and by switching to PD 104 control. At this stage of the initialization process, the dedicated UP and DOWN signals are used to evaluate clock rising edge positioning with high accuracy while UP and DOWN outputs are still held by the HLD signal in order to still only increase the VCDL 102 delay. Alternatively, the lock detector 111 can remain in control while the PD 104 is held to produce UP and DOWN output signals to increase the VCDL 102 delay time.

At step 210, the clock (CKref, CKf) advances one cycle. The next rising edges of the reference clock signal CKref and the feedback clock signal CKf are detected and the degree of proximity is measured.

At step 212, if the second lock point has been reached with a desired degree of proximity, process continues with step 214. If not, process continues with step 210 to continue to monitor the degree of alignment between the reference clock signal CKref and the feedback clock signal Ckf.

At step 214, the more accurate final lock is reached, and the PD 104 is released by switching the HLD signal to "release" state.

At step 216, the PD 104 controls the control voltage Vc and normal DLL operation begins.

Other embodiments of a DLL are shown in FIGS. 12-15.

Figure 12:
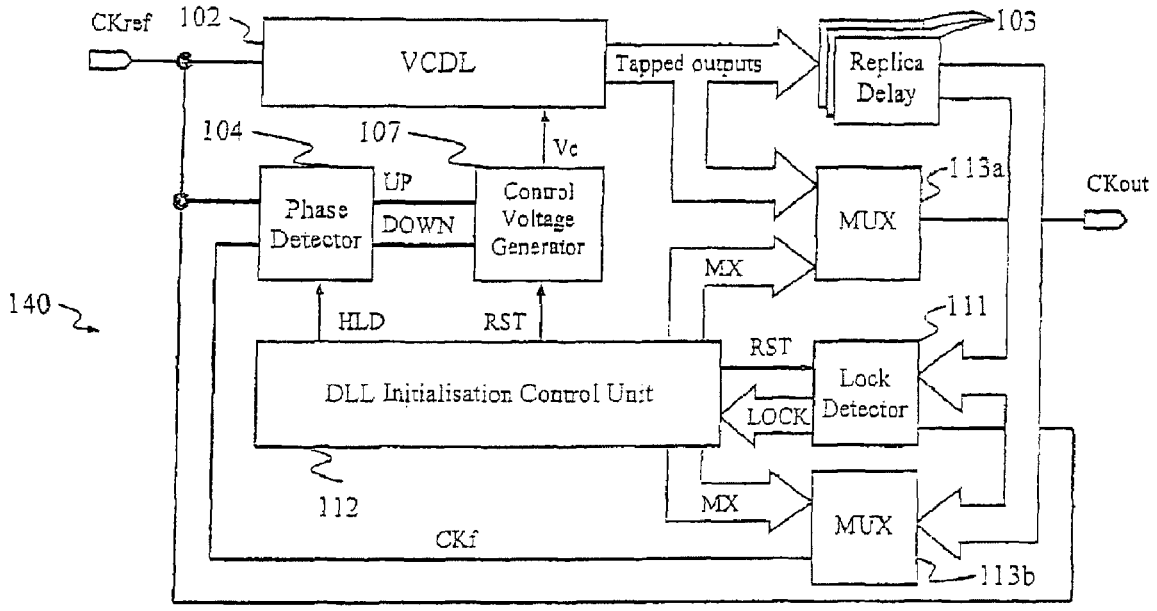
FIGS. 12-15 are block diagrams of alternate embodiments of a DLL including DLL initialization according to the principles of the present invention.

FIG. 12 is a block diagram of an alternate embodiment of a DLL 140 including DLL initialization according to the principles of the present invention. This embodiment is more suitable for cases where faster DLL initialization is required, that is, when the time needed for reaching the final DLL lock point and switching to normal DLL operation is critical.

The DLL 140 has many common elements with the embodiment of the DLL 500 described in conjunction with FIG. 5. The DLL includes a VCDL 102 having a plurality of tapped outputs 116 or 116a, a PD 104, a control voltage generator 107, a multiplexer 113, and a DLL initialization control 112 as discussed in the embodiment shown in FIG. 5. In contrast to the single replica delay 103 in the DLL 500 shown in FIG. 5, DLL 140 includes a plurality of replica delay blocks 103, with one replica delay block 103 for each of the VCDL 102 tapped outputs 116 or 116a.

The lock detector 111 has an internal structure as shown in FIG. 9, with a plurality of stages 118 equal in number to the number of the VCDL tapped outputs 116 or 116a. Both timing intervals T1 and T2 in all stages 118 are set to same value. The value of the timing interval T1, T2 is much smaller than the delay time between two adjacent VCDL taps 116 or 116a. The LOCK code output by the lock detector 111 includes LC, LT and ER outputs of all stages 118. This allows for higher accuracy in determining mutual positioning of the clock signals' rising edges. Two multiplexers 113a-b are used: multiplexer 113a for selecting the DLL output clock signal from a number of VCDL 102 tapped outputs and multiplexer 113b for selecting the feedback clock signal CKf. Both multiplexers 113a-b are controlled by the same MX multi-bit code. In comparison to the embodiment described in conjunction with FIG. 5, additional silicon area overhead is needed to accommodate the two multiplexers 113a-c, the plurality of replica delays 103 and the clock detector stages 118 in the lock detector 111 to provide the higher accuracy and faster time to lock.

Clock signals from tapped VCDL outputs 116 or 116a are forwarded to the replica delays 103 and to the first multiplexer 113a. After having passed through the replica delays 103, the clock signals are forwarded to lock detector 111 and the second multiplexer 113b. The DLL initialization control 112 controls the initialization process described in conjunction with FIG. 11. On power up or system reset, control voltage generator 107 resets control voltage Vc to the boundary value so that the VCDL 102 produces minimum delay. The reset signal shown in the embodiment in FIG. 5 has been removed for simplicity. The state of the HLD signal value is set to "hold" to hold the PD 104 in delay increasing mode, the lock detector 111 is reset and the MX multi-bit code is either set to a default value or left at an initial random value at this time.

The desired degree of proximity is set by allowing the lock detector 111 to control the control voltage Vc and holding PD 104 in "hold" mode. After a few clock cycles, the LOCK code value stabilizes and indicates with high accuracy the phase difference between the clock signals CKref, DKf based on the position of the rising edges of the plurality of clock signals at the outputs of the replica delays 103 compared to the rising edge of the reference clock signal CKref. Using the LOCK code value received from the lock detector 111, the DLL initialization control 112 selects the closest version of the clock output from the VCDL 102 for the output clock signal CKout through multiplexer 113a and the respective version of the clock signal CKf output from the replica delay unit 103 to feed back to PD 104 through multiplexer 113b.

In order to determine the value for the MX code, it is important to note that the versions of the clock signals selected by both multiplexers 113a, 113b relate to the same tapped output of the VCDL 102. Thus, the versions of the clock signals are selected by the MX code and the phase shift is performed almost directly after the reset or power up. After the phase shift, the operating point of the DLL is close to the second lock point 606 (FIG. 6A) and the DLL initialization control 112 gradually increases the control voltage Vc through the PD 104 while the HLD signal holds the outputs of the PD 104, so that the PD 104 only increases the VCDL delay. The increase in control voltage Vc continues until the second lock point 606 (FIG. 6A) is reached. After the second lock point 606 (FIG. 6A) is reached, the DLL initialization control 112 changes the state of the HLD signal to "release" and the desired lock proximity degree is switched to "accurate" by transferring control of the control voltage Vc to the PD 104. Normal operation of the DLL starts. Even in this "lock accelerated" embodiment DLL can not be brought exactly to the second lock point by the phase shifting only while Vc remains at the value corresponding to minimum delay. As discussed above, the margin is needed for VCDL delay variation compensating for clock edge drifts and operation condition change. Therefore the phase shift brings DLL to the second lock point as close as the margin and the rest of the way (the margin) is covered by gradually modifying Vc.

Figure 1:
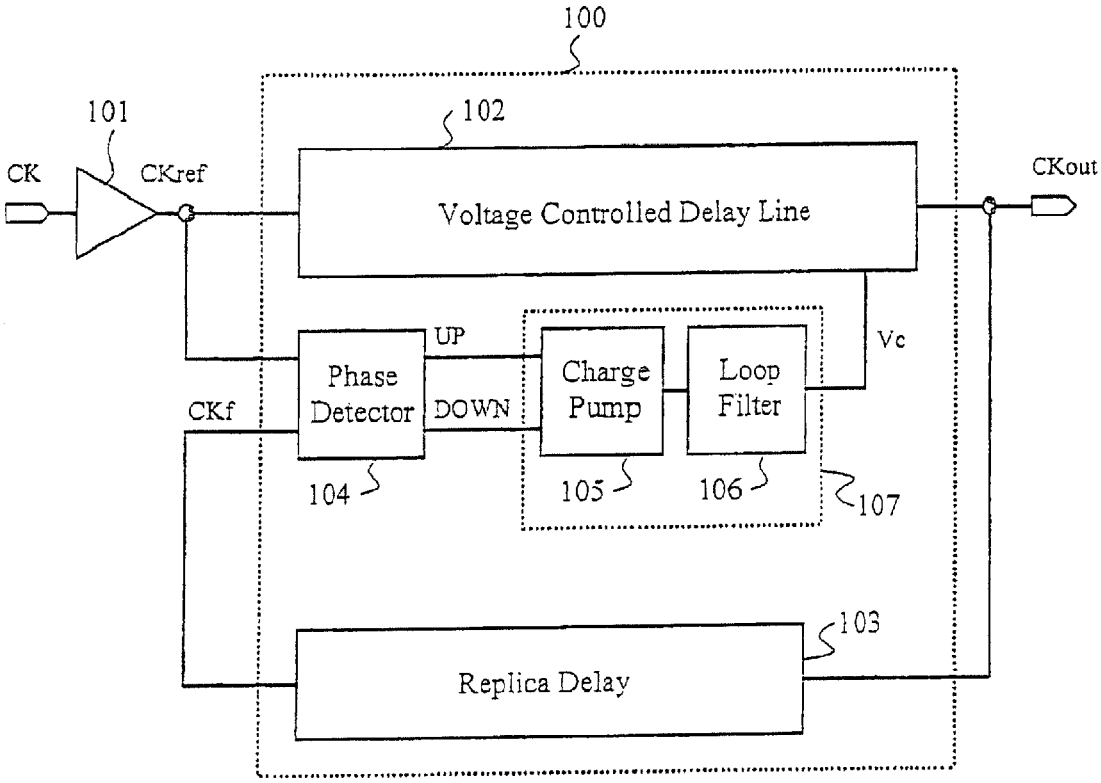
Prior art Fig. 1
FIG. 1 is a block diagram of a prior art conventional Delay Locked Loop (DLL)
Figure 2:
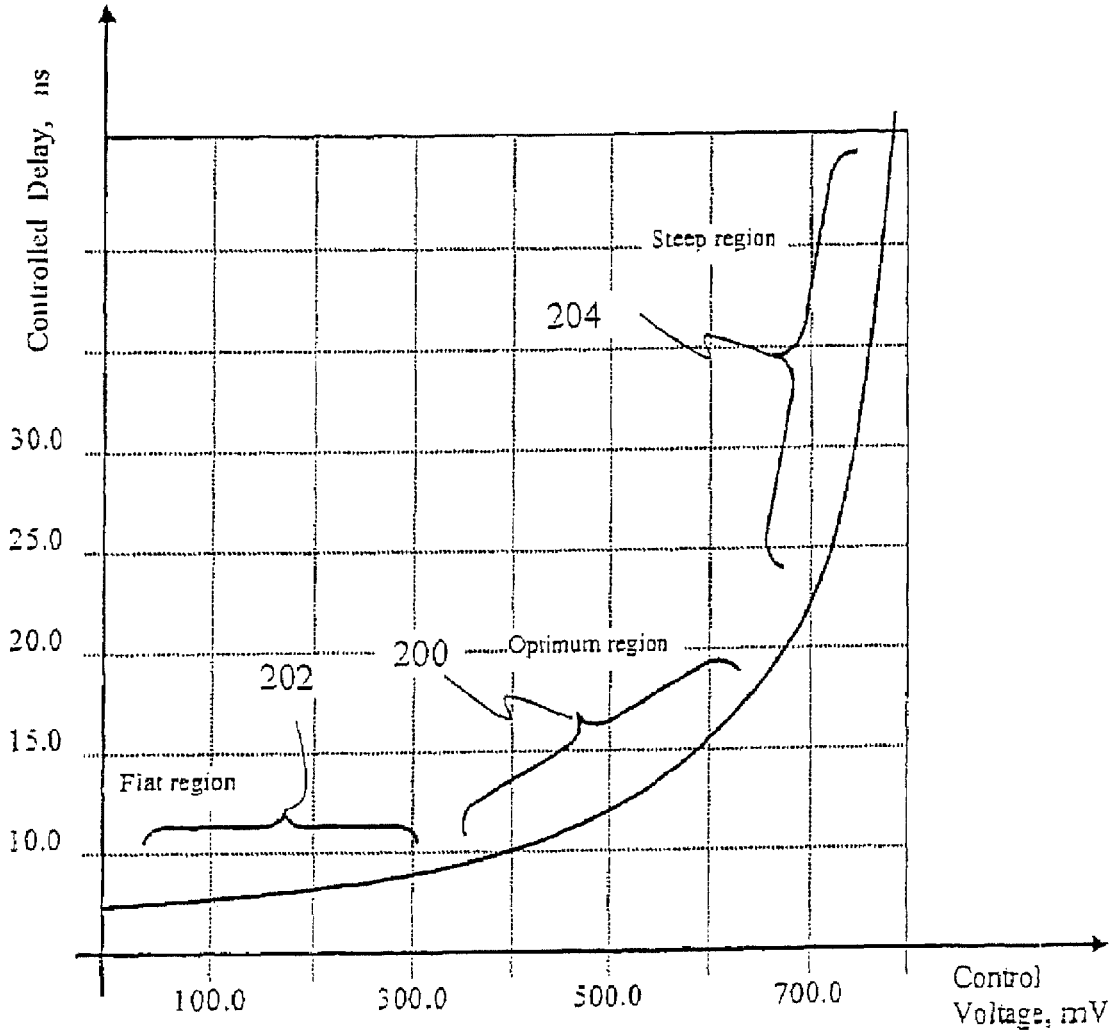
FIG. 2 is a graph illustrating a typical control voltage Vc vs. VCDL delay characteristic.
Figure 13:
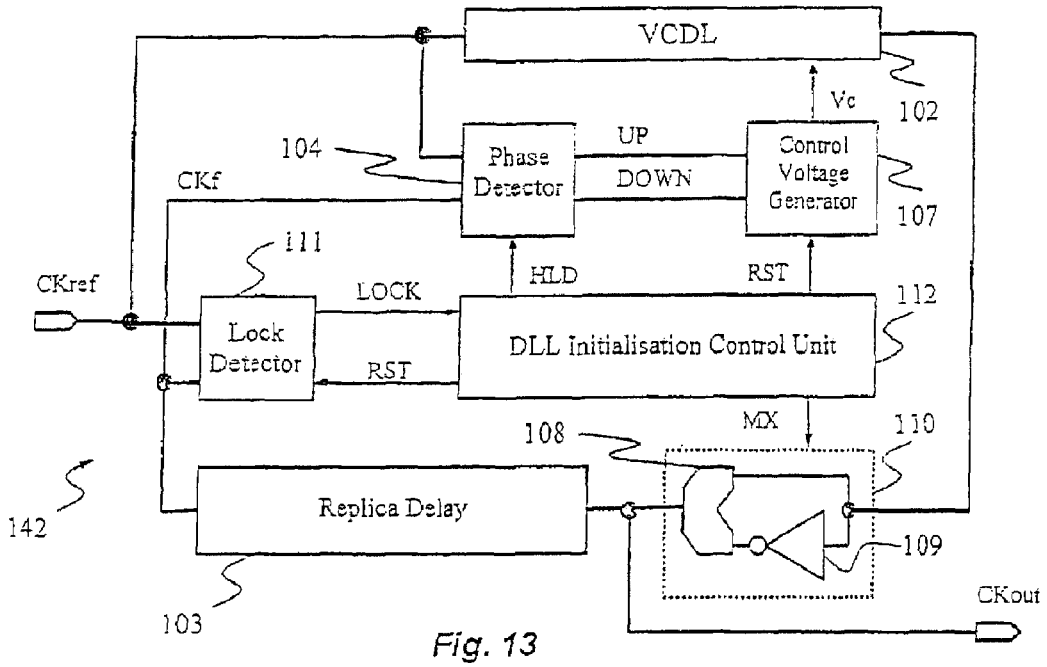
Figure 14:
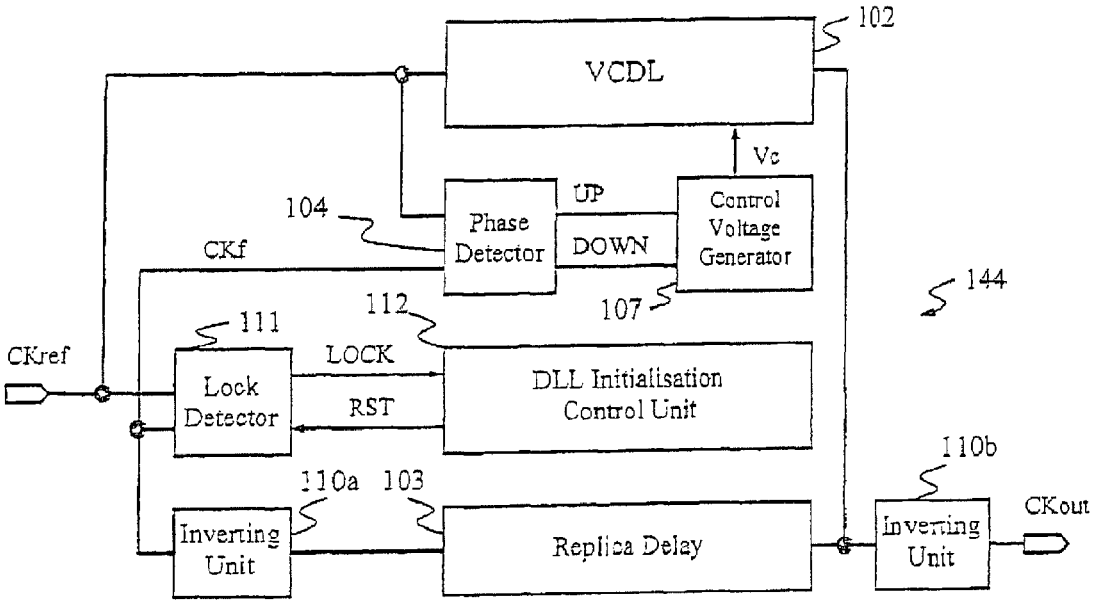
Figure 15:
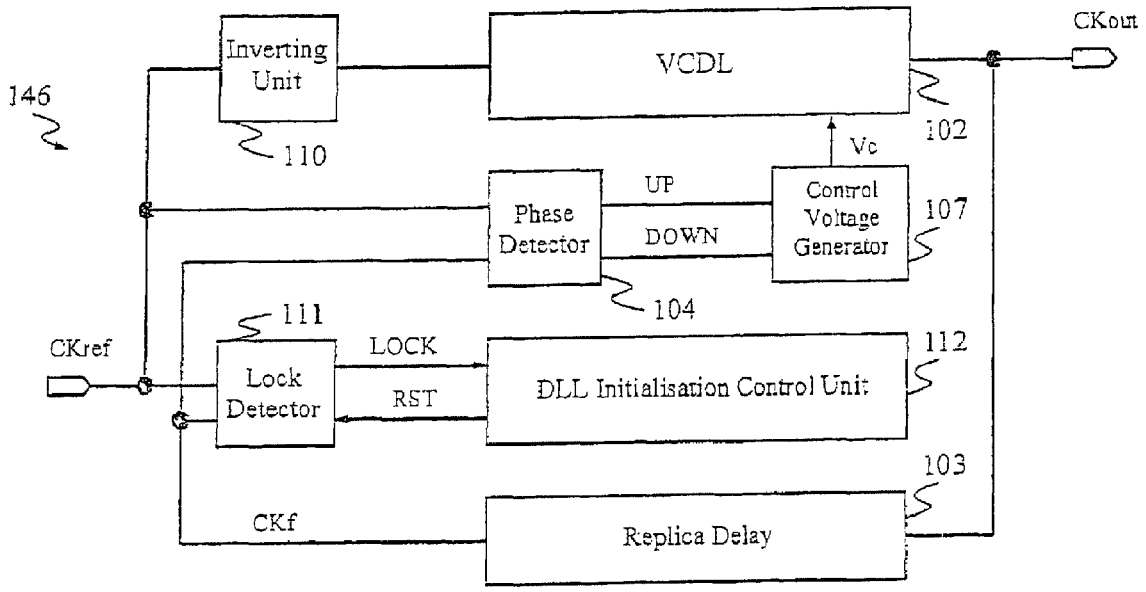

The embodiments of the DLL shown in FIGS. 13-15 include an inverting unit 110 that is not used in the embodiment of the DLL previously described in conjunction with FIG. 5 or in the prior art DLL described in conjunction with FIG. 1.

Referring to FIG. 13, in the simplest case, the inverting unit 110 includes an inverter 109 and multiplexer 108. The function of the inverting unit 109 is to split an input signal into an inverted and non-inverted version and to select one of the versions to be supplied to the output according to the logical value of a single-bit MX signal. For example, when the MX signal is '0', the non-inverted version of the signal is output, when the MX signal is '1' the inverted version of the signal is output or vice versa. Therefore, the inverting unit 110 is similar to the multiplexer 113 that has previously been described in conjunction with the embodiment shown in FIG. 12.

As is well-known to those skilled in the art, there are many possible ways to implement the function of the inverting unit 110. As the inverting unit 110 is not a subject of this invention, these are not discussed here. Any variant can be chosen as long as the unit function is provided. One skilled in the art will understand that the internal structure of the inverting unit 110 can be different from that shown in FIG. 13. For example, the inverting unit 110 can have a single ended or differential input and a differential output with phase or counter-phase output selected by the MX signal. The inverting unit 110 can also include an additional chain balancing delay of the two paths inside the unit—inverting and non-inverting. It is also understood that the inverter 109 may not be necessary in the inverting unit 110 in cases when the VCDL 102 output provides the signal and complement pair 117a (FIG. 8) or signal and complement 117 and 117' (FIG. 7). In this case the inverting unit 110 includes a 2-input and 1-output version of the multiplexer 113.

The embodiment of the DLL shown in FIG. 13 does not find the lock point as quickly as the embodiment described in conjunction with FIG. 12. However, the embodiment in FIG. 13 is simpler to implement and requires less silicon area overhead.

The DLL 142 includes only one VCDL output, one inverting unit 110 and a lock detector 111 with only one stage 118. Alternatively, in the case when the VCDL 102 provides output signals and their complements 117a as shown in FIG. 8, the inverting unit 110 can be replaced by a 2-input and single-output multiplexer 113. The timing intervals T1 and T2 in the lock detector 111 are set to a small fraction of the clock period. The lock detector 111 detects the lock point only when the rising edges of the reference clock signal CKref and the feedback clock signal CKf are close to each other.

The DLL initialization control 112 gradually increases the delay from the initial delay after reset or power-up. After the first lock point 604 (FIG. 6A) is detected based on the state of the lock signal, the inverting unit 110 switches to the inverted clock based on the MX signal output by the DLL initialization control 112 thus jumping over the first lock point. After the inverting unit 110 switches, the PD 104 is still held by the HLD signal to only increase the delay by increasing the control voltage Vc. The DLL 142 continues to gradually increase delay by increasing the control voltage Vc based on the time delay between the rising edges of the reference clock signal CKref and the feedback clock signal CKf. After the second lock point 606 (FIG. 6A) is detected, the PD 104 is released by changing the state of the HLD signal and normal operation starts.

In the embodiments of the DLL shown in FIGS. 14 and 15, the inverting unit 110 is connected in a different location from the previously discussed embodiments.

Referring to FIG. 14, the DLL 144 includes two inverting units 110a, 110b. The input of inverting unit 110a is connected to the output of the replica delay 103. The input of inverting unit 110b is connected to the output of the VCDL 102. The output of inverting unit 110a is a DLL output clock signal CKout. The output of inverting unit 110b is a DLL internal feedback clock signal CKf that is coupled to the input of the PD 104 and the input of the lock detector 111.

Referring to FIG. 15, DLL 146 includes one inverting unit 110 that is coupled between the reference clock signal CKref and the input of the VCDL 102, that is in the reference clock signal CKref path.

Neither DLL 144 (FIG. 14) or DLL 146 (FIG. 15) shows a Reset signal or MX, RST, HLD internal DLL signals. These signals were removed from the diagrams for simplicity. One skilled in the art will understand that all those signals are present in the system and applied in the same manner as they are applied in all previously discussed embodiments.

One skilled in the art will recognize that DLL structures using the DLL initialization process are not limited to those described. An experienced designer can design other DLL structures that will benefit from the ideas described here with respect to the DLL initialization process.

In other embodiments, a DLL searches for a lock point by starting from a point of the delay vs. control voltage characteristic close to the maximum delay. The direction of the search for a lock point during initialization is restricted to delay decrease only, that is, a phase detector is forced to produce only a combination of UP and DOWN signals that corresponds to delay decrease, depending on internal structure of the phase detector. In one embodiment, the starting point is below the steep area corresponding to maximum delay in order to avoid this area. As the operating point will be below the initial delay, only some of the stages in the DLL might be used, others might be disabled during initialization.

The static phase error in a charge pump is minimized through the use of an active current source. The active current mirror also mitigates the effects of low power supply voltage. According to an embodiment of the invention, a charge pump includes a pull-up circuit, a pull-down circuit and an operational amplifier. The pull-up circuit supplies a pull-up current to increase voltage at the charge pump output. The pull-down circuit supplies a pull-down current to decrease voltage at the charge pump output. The operational amplifier has a first input and a second input. The first input is coupled to the charge pump output and the second input coupled to a drain of a transistor that supplies current to the pull-down circuit. The operational amplifier output is coupled to the transistor and the pull-down circuit. The operational amplifier adjusts the voltage level at the operational amplifier output so that the voltage difference between the operational amplifier inputs is minimized and the difference between the pull-down current and the pull-up current is decreased.

The charge pump may also include a startup circuit coupled to the first input of the operational amplifier which sets the voltage at the first input to a voltage level below the power supply voltage during power-up of the charge pump. In an embodiment of the present invention, the power supply voltage supplied to the charge pump may be about one volt.

The pull-up circuit includes a first PMOS device and a second PMOS device. The drain of the first PMOS device is coupled to the source of the second PMOS device, the source of the first PMOS device is coupled to the power supply voltage node (or rail) and the drain of the second PMOS device is coupled to the charge pump output. The pull-up circuit supplies pull-up current while the first PMOS device is on.

The pull-down circuit includes a first NMOS device and a second NMOS device. The drain of the first NMOS device is coupled to the source of the second NMOS device, the source of the first NMOS device is coupled to ground and the drain of the second NMOS device coupled to the charge pump output. The pull-down circuit supplies pull-down current while the first NMOS device is on.

The charge pump also includes a reference current source which supplies current to the pull-down circuit and the pull-up circuit. In one embodiment, the reference current source includes a programmable array of transistors. The operational amplifier may be a low power rail to rail input, rail to rail output operational amplifier.

Figure 16:
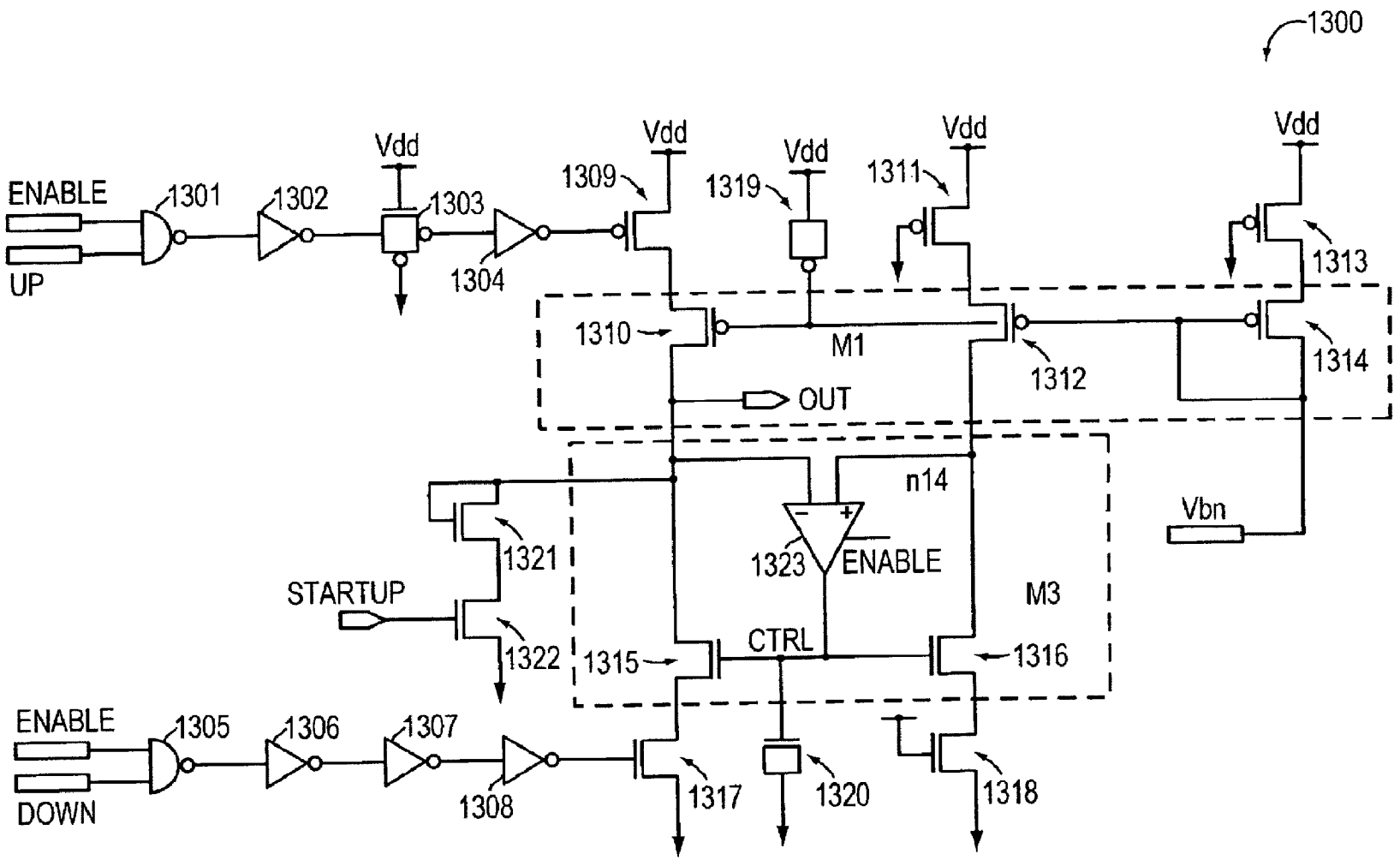
FIG. 16 shows a charge pump according to the present invention.

FIG. 16 is a schematic of a charge pump 1300 according to the principles of the present disclosure. The charge pump 1300 includes a plurality of transistors. In the embodiment shown, the transistors are metal-oxide semiconductor ("MOS") transistors, also referred to as field effect transistors ("FET"). As is well-known to those skilled in the art, there are two types of MOS transistors: n-channel MOS transistors (NMOS) and p-channel MOS transistors (PMOS). The charge pump 1300 includes both NMOS and PMOS transistors. The PMOS transistors are graphically illustrated with a circle at the gate. The charge pump 1300 includes current mirror M1 and active current mirror M3. The active current mirror M3 includes an operational amplifier ("op amp") 1323 which minimizes static phase error by actively making the voltage on node "OUT" substantially equal to the voltage on node 'ctrl' to minimize the difference between the output (drain) current (charge-pump pull-down current) of transistor 1315 and the output (drain) current (charge pump pull-up current) of transistor 1310.

Current mirror M1 includes bias PMOS transistor 1314 and NMOS transistors 1310 and 1312. Voltage $V_{bn}$ sets the bias voltage for current mirror M1 and sets the current that flows through PMOS transistor 1314. PMOS transistors 1314 and 1313 provide a reference current source which supplies current to a pull-down circuit and a pull-up circuit. The current through PMOS transistor 1314 is mirrored in PMOS transistors 1312 and 1310. The current that flows through each transistor in a current mirror can be modified by varying the sizes (width/length ratios) of these devices as is well-known to those skilled in the art.

PMOS device 1314 in current mirror M1 provides the initial current to the charge pump dependent on the voltage provided by bias voltage $V_{bn}$ at the node of the source-drain connection of PMOS device 1314. When the charge pump is used in a DLL system, the bias voltage adjusts the maximum current of the charge pump according to the total delay of the delay chain so that the ratio between the reference frequency and DLL bandwidth stays constant.

The gate of PMOS transistor 1314 is coupled to the drain of PMOS transistor 1314. The gates of PMOS devices 1312 and 1310 are coupled to the gate of PMOS device 1314 allowing this initial current to be mirrored to PMOS transistors 1312 and 1310. The drain of NMOS device 1316 is coupled to the drain of PMOS device 1312. Thus, the current mirrored to PMOS device 1312 is the same current provided to NMOS device 1316 in current mirror M3. The gate of NMOS device 1316 is coupled to the gate of NMOS device 1315, allowing the drain current of NMOS device 1316 to be mirrored to NMOS device 1315 in current mirror M3 to provide the pull-down current.

Generally, when the charge pump is enabled (signal ENABLE is asserted or driven to a logic 1) and signal UP is asserted, transistor 1309 is turned 'on' by the voltage applied to the gate of transistor 1309 through NAND gate 1301, inverters 1302 and 1304 and pass gate 1303. This allows current to flow through PMOS transistors 309 and 1310 in the pull-up circuit. This current adds charge into the OUT node which is coupled to the loop filter. This increase in charge while transistor 1309 is 'on' results in an increase in voltage at node OUT, which when the charge pump 1300 causes an increase in the delay generated by the voltage controlled delay line. Similarly, when the charge pump is enabled (ENABLE high) and signal DOWN is asserted, transistor 1317 is turned 'on' by the voltage applied to the gate through NAND gate 1305 and inverters 1306, 1307 and 1308. This allows current to flow through transistors 1315 and 1317 in the pull-down circuit. This current flow from node OUT to ground through transistors 1315, 1317 takes charge away from node OUT. This reduction in charge while transistor 1315 is 'on' results in a decrease in voltage at node OUT and a decrease in the delay generated by the voltage controlled delay line.

The paths from the UP/DOWN signals at the input of NAND gates 1302, 1304 through inverters 1303, 1304 and through inverters 1307, 1308 to the gate of transistors 1310, 1315 are matched to provide the same insertion delay. The pass gate 1303 is included in the path to replicate the delay added by inverter 1307 in the path from the DOWN signal to the gate of transistor 1317. To compensate for the small voltage drop across the source drain path of NMOS transistor 1309 when transistor 1309 is 'on', PMOS transistors 1311 and 1313 are added to provide symmetry with the current path through PMOS transistor 1309. NMOS transistor 1318 provides symmetry with the current path through PMOS transistor 1315.

Current mirror M3 controls the ratio between pull-down current (through NMOS transistor 1315 to ground) and pull up current (from $V_{dd}$ through PMOS transistor 1310). The pull-down current reduces the voltage at node OUT and the pull-up current increases the voltage at node OUT. Thus, the M1 current mirror sets the maximum current of the charge pump through PMOS device 1310 and the M3 current mirror controls the ratio between the pull up and pull down current. Current mirrors M1 and M3 may be adjustable or programmable through the use of well-known techniques. Transistors 1315 and 1316 in current mirror M3 may be sized to deliver more or less current. This allows the circuit designer to compensate for other factors such as parasitic resistances and capacitances and parameter variations. However, such adjustments are static and cannot be re-adjusted once the chip has been packaged and it cannot compensate for voltage change at the OUT node.

According to one embodiment of the invention, an active adjustment of the current mirrors is provided through the use of an operational amplifier, as shown in FIG. 16. The inverting input of the operational amplifier 1323 in active current mirror M3 is coupled to node OUT and the non-inverting input of operational amplifier 1323 is coupled to node 'n14'. The output node of the operational amplifier 1323 is coupled to node 'ctrl' and the gates of NMOS devices 1315, 1316. Operational amplifier 1323 adjusts the voltage on the control node 'ctrl', if there is any voltage difference between nodes OUT and 'n14'. A change in voltage on control node 'ctrl' results in a corresponding change in voltage on node OUT and node 'n14' through NMOS devices 1315, 1316.

During operation of the charge pump, the operational amplifier 1323 minimizes the static phase error by actively keeping the voltage on node 'n14' substantially equal to the output voltage on node OUT. It is important to be able to produce the same pull-up and pull-down current pulses at the output ("OUT") when the DLL is in lock condition. In a DLL which has achieved lock condition, node OUT is not actively being charged or discharged most of the time as the UP and DOWN pulses are of equal duration. Furthermore, the UP and DOWN pulses can be of shorter duration than in the prior art charge pumps resulting in a reduction of power required in the device. Thus, the voltage at node OUT remains substantially constant. Changes in voltage at node 'ctrl' result in a corresponding change in the currents flowing in NMOS transistors 1315, 1316. However, the change in voltage at node 'ctrl' affects node 'n14' more quickly than node OUT because the capacitance of node 'n14' is smaller than the capacitance present at node OUT.

The operational amplifier 1323 actively controls the voltage at node OUT as follows: if the voltage on node 'n14' is higher than the voltage at node OUT, the operational amplifier 1323 increases the voltage at node 'ctrl'. The increase in voltage at node 'ctrl' results in an increase in the current flowing through NMOS transistor 1316 and NMOS transistor 1315 which reduces the voltage on node 'n14' until it is the same as the voltage at node OUT. If the voltage on node 'n14' is less than the voltage on node OUT, the operational amplifier 1323 decreases the voltage on node 'ctrl'. This decrease in the voltage on node 'ctrl' results in a decrease in the current flowing in NMOS transistor 1316 and NMOS transistor 1315. As the voltage at node 'ctrl' changes the voltage on node 'n14' faster than on node OUT, a new balance point is reached with the voltage on node 'n14' equal to the voltage on node OUT. With the voltage on node 'n14' and the output voltage OUT being substantially the same, the source/drain current (pull-down current) through NMOS device 1315 is substantially equal to the source/drain current (pull-up current) through PMOS device 1310.

By providing an active current mirror including an operational amplifier to the charge pump, the voltage conditions at drain, source and gate of NMOS transistors pair 1315 and 1316 and PMOS transistors pair 312 and 310 are substantially equal and much closer than in the prior art circuits, resulting in a very accurate matching current through NMOS transistor 1315 and PMOS transistor 1310. Transistors 1319 and 1320 are simple buffer capacitances, which prevent the noise caused by NMOS device 1315 and PMOS device 1310 to couple into the respective bias nodes of the current mirrors M1, M2.

The operational amplifier 1323 preferably has an input range from rail to rail (Vdd to Vss (ground)). In an embodiment in which transistors 1315, 1316 are NMOS devices with the required output range is from Vdd down to a predetermined voltage close to above ground, i.e. one threshold voltage of an NMOS transistor above ground (Vtn). This output voltage range ensures that NMOS transistors 1315 and 1316 can never be fully turned off, as this would make the circuit inoperable. In an alternate embodiment in which transistors 1315, 1316 are PMOS devices, the required output range is from Vss to Vtp (i.e, one threshold voltage of a PMOS transistor below Vdd). Thus, an operational amplifier 1323 with a rail to rail output range is preferred.

During the power up phase, if the voltage at node 'n14' is lower than the voltage at node OUT, the output of the operational amplifier, that is, node 'ctrl' is driven low. As node 'ctrl' is coupled to the gate of NMOS device 1315, NMOS device 1315 will likely turn 'off'. The circuit may freeze in this state or may take a long time to recover. Either case is undesirable.

A start up circuit including NMOS device 1321 and NMOS device 1322 assists the charge pump 1323 in reaching its operating point during the power up phase. The start up circuit initially sets the voltage of node OUT to a value less than $V_{dd}$. This allows the operational amplifier 1323 to operate properly after the power up phase. A startup signal that is asserted for a predetermined time period after power up during the power up phase is coupled to the gate of NMOS device 1322. NMOS device 1322 is diode coupled with both the gate and source coupled to the node OUT. The drain of NMOS device 1322 is coupled to the drain of NMOS device 1322.

While the startup signal coupled to the drain of NMOS device 1321 is asserted, the NMOS device 1322 is 'on'. Node OUT is approximately equal to $V_{dd}$, thus, with both NMOS device 1321 and NMOS device 1322 'on', current flows through NMOS device 1321 and NMOS device 1322 resulting in a decrease in the voltage at node OUT.

Thus, the startup circuit ensures that the voltage at node OUT is less than the voltage at node 'n14' during the power up phase, so that the differential input voltage to the operational amplifier 1323 is initially positive and node 'ctrl' at the output of the operational amplifier 1323 is driven 'high' during the startup phase holding NMOS device 1315 is on. This forces node OUT to approximately the threshold voltage of an NMOS transistor for this predetermined time period. After the power up phase, the startup signal is de-asserted and the startup circuit is no longer required to be enabled.

The present invention reduces the current offset, i.e. the difference in currents flowing between NMOS transistor 1315 and PMOS transistor 1310 to about 4%. This results in a highly reduced static phase error for the overall DLL system. By reducing the current offset of the charge pump from 20% to 4% in this embodiment, the overall static phase error of the PLL/DLL is reduced from 300 ps to 60 ps.

While this invention has been particularly shown and described with references to preferred embodiments thereof, it will be understood by those skilled in the art that various changes in form and details may be made therein without departing from the scope of the invention encompassed by the appended claims.

What is claimed is:

1. A delay locked loop for providing a delay for a *reference* clock signal, the delay locked loop having [a plurality of] *at least one* potential lock point[s at plural delays], *and* the delay locked loop comprising:

a lock point proximity detector which detects proximity to the *at least one potential* lock [points] *point*;

an initialization control circuit coupled to an output of the lock point proximity detector[, said initialization control circuit being connected to a multiplexer];

[a voltage controlled delay line; and]

an inverting circuit [being connected to the voltage controlled delay line, and connected to the multiplexer, the inverting circuit capable of outputting at least] *that includes a multiplexer and at least one inverter having an output coupled to an input of said multiplexer, said inverting circuit for enabling selection of a single one of* two *clock* signals, based on an output of the initialization control circuit, to vary the delay of the *reference* clock signal*; and*

*a variable delay line having an output coupled to said inverting circuit*.

2. The delay locked loop of claim 1, wherein the inverting circuit has a single ended output.

3. The delay locked loop of claim 1, wherein the inverting circuit has a differential input and a differential output.

4. The delay locked loop of claim 1, wherein the inverting circuit is a second multiplexer, the second multiplexer including two inputs and a single output.

5. The delay locked loop of claim 1, wherein the initialization control circuit skips at least one lock point by the inverting circuit switching to an inverted clock signal based on a signal output by the initialization control circuit.

6. The delay locked loop of claim 1, [further comprising] *wherein said at least one inverter comprises* a plurality of [inverting circuits] *inverters*.

7. The delay locked loop of claim 6, further comprising a first inverting circuit being connected to the phase detector and a delay circuit; and further comprising a second inverting circuit being connected to the voltage controlled delay line and the delay circuit.

8. A delay locked loop for providing a delay for a clock signal, the delay locked loop having a plurality of potential lock points at plural delays, the delay locked loop comprising:

a lock point proximity detector which detects proximity to the lock points;

an initialization control circuit coupled to an output of the lock point proximity detector; and a voltage controlled delay line including a plurality of single-ended buffers connected in series to provide a delay line, each single-ended buffer having a single-ended input and a single-ended output with at least one single-ended buffer being connected to a control voltage.

9. The delay locked loop of claim 8, wherein the voltage controlled delay line includes a plurality of differential buffers with at least one differential buffer connected to the control voltage.

10. The delay locked loop of claim 9, wherein the plurality of differential buffers are connected in series.

11. The delay locked loop of claim 10, wherein the plurality of differential buffers each have at least one differential input and at least one differential output.

12. The delay locked loop of claim 11, wherein at least one buffer has a single ended input that receives a reference clock signal and the buffer has the differential output.

13. The delay locked loop of claim 8, wherein the voltage controlled delay line comprises a plurality of tapped differential outputs.

14. The delay locked loop of claim 8, wherein the voltage controlled delay line comprises a single differential output.

15. The delay locked loop of claim 8, wherein the plurality of potential lock points at plural delays is more than two, or wherein the plurality of potential lock points at plural delays is in a range of about three to about five.

16. A delay locked loop (DLL) comprising:

a voltage controlled delay line;

a control voltage generator that provides a DLL control voltage to said voltage controlled delay line;

a phase detector that causes adjustment of said control voltage in a manner that brings said control voltage closer to a target voltage level; and a lock point proximity detector that receives a first clock signal and a second clock signal, the lock point proximity detector providing a lock detection signal based on a phase difference between the first and the second clock signals, the lock point proximity detector circuit comprising at least two flip flops and a plurality of delay lines.

17. The delay locked loop of claim 16, wherein the lock point proximity detector comprises a plurality of self contained stages with each self contained stage having the at least two flip flops and at least one delay line.

18. The delay locked loop of claim 16, wherein each of the plurality of delay lines includes a predetermined delay time interval embedded in the delay line.

19. The delay locked loop of claim 18, wherein each of the plurality of delay lines includes a different predetermined delay time interval.

20. The delay locked loop of claim 19, wherein the plurality of delay lines includes a first delay line being connected in series to a second delay line.

21. A method for initializing a delay locked loop comprising:

varying a delay of a clock signal;

skipping a first potential lock point of a plurality lock points by inverting at least one of two clock signals; and continuing to vary the delay of the clock signal to search for an operating point.

22. A delay locked loop circuit for providing a delay for a clock signal, the delay locked loop having a plurality of potential lock points at plural delays, the delay locked loop comprising:

a lock point proximity detector which detects proximity to the lock points;

an initialization control circuit coupled to an output of the lock point proximity detector;

said initialization control varies the delay of the clock signal to search for a middle region operating point selected from the plurality of potential lock points;

a voltage controlled delay line; and a control voltage generator that provides a DLL control voltage to said voltage controlled delay line, the control voltage generator including a charge pump that includes an operational amplifier to reduce a static phase error of the charge pump.

23. The delay locked loop of claim 22, wherein the charge pump further includes a pull-up circuit which supplies a pull-up current to increase voltage at a charge pump output, and a pull-down circuit which supplies a pull-down current to decrease voltage at the charge pump output.

24. The delay locked loop of claim 23, wherein the operational amplifier has a first input and a second input, the first input coupled to the charge pump output and the second input coupled to a drain of a transistor that supplies current to the pull-down circuit, the operational amplifier output coupled to the pull-down circuit and a gate of the transistor, the operational amplifier adjusting a voltage level at the operational amplifier output dependent on a voltage difference between the inputs to minimize the voltage difference between the inputs and decrease a difference between the pull-down current and the pull-up current.

25. The delay locked loop of claim 24, further comprising a startup circuit being coupled to the first input which sets the voltage at the first input to a voltage level below a power supply voltage during a power-up of the charge pump.

26. A method for initializing a delay locked loop comprising:

varying a delay of a clock signal having a plurality of potential lock points in one direction from an initial delay;

skipping a first potential lock point of the plurality lock points by receiving a first clock signal and a second clock signal and providing a lock detection signal based on a phase difference between the first and the second clock signals; and continuing to vary the delay to search for an operating point.

27. A method for initializing a delay locked loop comprising:

varying a delay of a clock signal having a plurality of potential lock points in one direction from an initial delay; and skipping a first potential lock point of the plurality lock points and continuing to vary the delay of the clock signal in the same one direction by passing a control voltage through a plurality of single-ended buffers.

28. A method of searching for a lock point comprising:

varying a delay of a clock signal by starting from a predetermined point of a delay versus a control voltage characteristic, the predetermined point of the delay versus the control voltage characteristic being located an amount away from a maximum delay on the delay versus the control voltage characteristic; and only increasing the delay to search for the lock point.

29. The method of claim 28, further comprising:

identifying the predetermined point being below a predetermined area corresponding to the maximum delay on the delay versus the control voltage characteristic; and optionally (i) identifying the predetermined point being above a predetermined area corresponding to the maximum delay on the delay versus the control voltage characteristic; and (ii) decreasing the delay to search for the lock point.

30. A method for initializing a delay locked loop comprising:

searching for a middle region operating point selected from a plurality of potential lock points at plural delays, said searching for the middle region operating point including varying a delay of a clock signal; and reducing a static phase error when varying the delay.

31. The method of claim 30, wherein said searching further includes skipping a first potential lock point at an end of a range of delays provided by a delay line, said skipping occurring in the direction toward another potential lock point within said range.

32. The method of claim 31, wherein the first potential lock point is a least stable point of the plurality of potential lock points.

33. The method of claim 31, wherein the first potential lock point is skipped by shifting a phase of a clock signal.

34. The method of claim 33, wherein the phase of the clock signal is shifted by less than or about equal to a half of the period of the clock signal.

35. The method of claim 33, wherein voltage controlled delay line tapped outputs are used to shift the phase of the clock signal.

36. The method of claim 33, wherein the phase of the clock signal is shifted by performing a phase shift of an internal clock signal in the delay locked loop.

37. The method of claim 36, wherein the internal clock signal is a voltage controlled delay line input clock signal.

38. The method of claim 36, wherein the internal clock signal is a voltage controlled delay line output clock signal.

39. The method of claim 31, wherein proximity to the first potential lock point is detected based on alignment of edges of a reference clock and a delayed feedback clock.

40. The method of claim 39, wherein the proximity to the first potential lock point is analyzed by applying a plurality of pre-set time intervals.

41. The method of claim 40, wherein values of the pre-set time intervals are based on delay times of replicas of stages in a voltage controlled delay line.

42. The method of claim 40, wherein values of the pre-set time intervals are smaller than a quarter of the clock period.

43. The method of claim 40, wherein values of the pre-set time intervals are a fraction of a delay time between two adjacent voltage controlled delay line tapped outputs.

44. The method of claim 42, wherein the values of the pre-set time intervals are set for rough lock point proximity evaluation.

*45. The delay locked loop of claim 1, wherein said at least one potential lock point is a plurality of potential lock points at plural delays.*

*46. The delay locked loop of claim 45, wherein said plurality of potential lock points is more than two, or wherein said plurality of potential lock points is in a range of about three to five.*

*47. The delay locked loop of claim 1, wherein said variable delay line is a voltage controlled delay line.*

*48. The delay locked loop of claim 47, wherein said voltage controlled delay line comprises a plurality of single-ended buffers connected in series.*

*49. The delay locked loop of claim 47, wherein said voltage controlled delay line comprises a plurality of differential buffers connected in series.*

*50. The delay locked loop of claim 1, further comprising a replica delay circuit having an input configured to receive said single one of the two clock signals.*

*51. The delay locked loop of claim 1, wherein said initialization control circuit engages after power-up.*

*52. The delay locked loop of claim 1, wherein said initialization control circuit engages after reset.*

* * * * *